US011817173B2

(12) United States Patent
Madhavan et al.

(10) Patent No.: US 11,817,173 B2
(45) Date of Patent: Nov. 14, 2023

(54) TIMING-BASED COMPUTER ARCHITECTURE SYSTEMS AND METHODS

(71) Applicants: University of Maryland, College Park, College Park, MD (US); THE UNITED STATES OF AMERICA AS REPRESENTED BY THE SECRETARY, DEPARTMENT OF COMMERCE, Washington, DC (US)

(72) Inventors: Advait Madhavan, Bethesda, MD (US); Matthew William Daniels, Silver Spring, MD (US); Mark David Stiles, Silver Spring, MD (US)

(73) Assignees: UNIVERSITY OF MARYLAND, COLLEGE PARK, College Park, MD (US); GOVERNMENT OF THE UNITED STATES OF AMERICA, AS REPRESENTED BY THE SECRETARY OF COMMERCE, Gaithersburg, MD (US)

(*) Notice: Subject to any disclaimer, the term of this patent is extended or adjusted under 35 U.S.C. 154(b) by 0 days.

(21) Appl. No.: 17/492,526

(22) Filed: Oct. 1, 2021

(65) Prior Publication Data

US 2022/0108736 A1    Apr. 7, 2022

Related U.S. Application Data

(60) Provisional application No. 63/086,453, filed on Oct. 1, 2020.

(51) Int. Cl.
*G11C 7/00* (2006.01)
*G11C 7/22* (2006.01)
(Continued)

(52) U.S. Cl.
CPC .............. *G11C 7/222* (2013.01); *G06F 17/16* (2013.01); *G11C 5/06* (2013.01); *G11C 7/1012* (2013.01);
(Continued)

(58) Field of Classification Search
CPC ....................................................... G06F 17/16
(Continued)

(56) References Cited

U.S. PATENT DOCUMENTS 5,010,401 A * 4/1991 Murakami ........... H04N 19/587
375/E7.193
9,154,172 B1  10/2015 Cruz-Albrecht et al.
(Continued)

OTHER PUBLICATIONS

Madhaven et al., "A 4-mm 2 180-nm-cmos 15-giga-cell-updates-per-second dna sequence alignment engine based on asynchronous race conditions." 2017 IEEE Custom Integrated Circuits Conference (CICC) IEEE, 2017. 1-4.
(Continued)

*Primary Examiner* — Hoai V Ho
(74) *Attorney, Agent, or Firm* — Quarles & Brady LLP

(57) ABSTRACT

Systems and methods are provided herein that implement and utilize temporal state machines and other temporal computational/memory circuits. For example, a temporal state machine is provided that comprises a temporal computational unit comprising at least one circuit to perform a time-domain operation, and a temporal memory unit. Both the temporal computational unit and temporal memory unit can operate using solely, or partially, time-encoded wavefronts. The computation unit accesses time-encoded wavefronts from the memory and can output and write time-encoded wavefronts back to the memory.

9 Claims, 22 Drawing Sheets

(51) Int. Cl.
*G11C 7/10* (2006.01)
*H03K 19/20* (2006.01)
*G11C 7/12* (2006.01)
*G06F 17/16* (2006.01)
*G11C 5/06* (2006.01)

(52) U.S. Cl.
CPC .......... *G11C 7/1069* (2013.01); *G11C 7/1096* (2013.01); *G11C 7/12* (2013.01); *H03K 19/20* (2013.01)

(58) Field of Classification Search
USPC .................................................. 365/189.14
See application file for complete search history.

(56) References Cited

U.S. PATENT DOCUMENTS

| | | | |
|---|---|---|---|
| 9,824,311 | B1 | 11/2017 | Cruz-Albrecht et al. |
| 10,469,126 | B1 | 11/2019 | Kilambi et al. |
| 2009/0009211 | A1 | 1/2009 | Ito et al. |

OTHER PUBLICATIONS

Madhaven et al., "A truth-matrix view into unary computing." Proceedings of the 1st Unary Computing Workshop (ISCA'19). 2019. 1-4.

Madhaven et al., "Energy efficient computation with asynchronous races." Proceedings of the 53rd Annual Design Automation Conference. 2016. 1-6.

Madhaven et al., "Race logic: A hardware acceleration for dynamic programming algorithms." ACM SIGARCH Computer Architecture News 42.3 (2014): 517-528.

Madhaven et al., "Race logic: abusing hardware race conditions to perform useful computation." IEEE Micro 35.3 (2015): 48-57.

Madhaven, Advait. Abusing Hardware Race Conditions for High Throughput Energy Efficient Computation. University of California, Santa Barbara, 2016. 1-141.

Najafi et al., "Low-cost sorting network circuits using unary processing." IEEE Transactions on Very Large Scale ntegration (VLSI) Systems 26.8 (2018): 1471-1480.

Smith, James E. "(Newtonian) Space-Time Algebra." arXiv preprint arXiv:2001.04242 (2019). 1-22.

Smith, James E. "A neuromorphic paradigm for online unsupervised clustering." arXiv preprint arXiv:2005.04170 (2020). 1-13.

Smith, James. "Space-time algebra: A model for neocortical computation." 2018 ACM/IEEE 45th Annual International Symposium on Computer Architecture (ISCA). IEEE, 2018. 289-300.

Tzimpragos et al., "A computational temporal logic for superconducting accelerators." Proceedings of the Twenty-Fifth International Conference on Architectural Support for Programming Languages and Operating Systems. 2020. (pp. 435-448).

Tzimpragos et al., "Boosted race trees for low energy classification." Proceedings of the Twenty-Fourth International Conference on Architectural Support for Programming Languages and Operating Systems. 2019. pp. 215-228.

Tzimpragos et al., "From arbitrary functions to space-time implementations." Proceedings of the 1st Unary Computing Workshop (ISCA'19). 2019. 1-4.

* cited by examiner

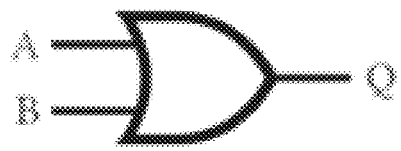
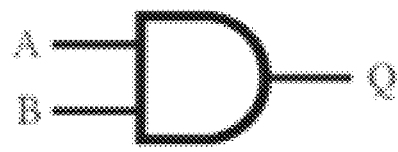
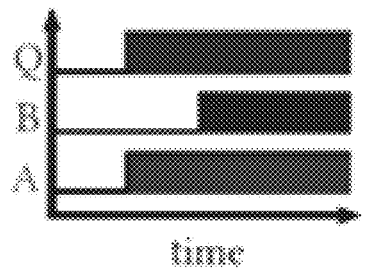
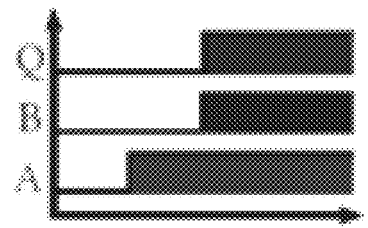
Fig. 5a    Fig. 5b
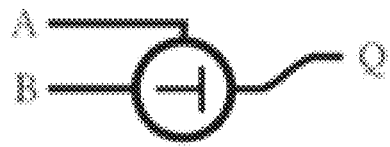
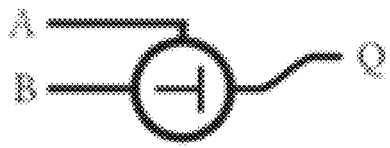
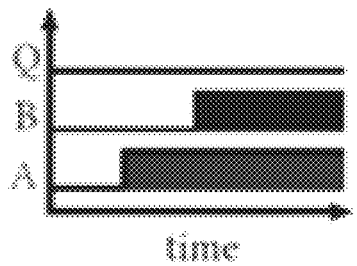
Fig. 5c    Fig. 5d

TIMING-BASED COMPUTER ARCHITECTURE SYSTEMS AND METHODS

CROSS-REFERENCE TO RELATED APPLICATIONS

This application claims priority to U.S. Provisional Application No. 63/086,453, filed on Oct. 1, 2020, which incorporated herein by reference in full.

STATEMENT REGARDING FEDERALLY SPONSORED RESEARCH

This invention was made with government support under 70NANB14H209 awarded by the National Institute of Standards and Technology. The government has certain rights in the invention.

BACKGROUND

The present disclosure relates in general to improvements in how computers compute. At present, the vast majority of computational components across the computational stack (e.g., circuits, architectures, and other mid- to high level-abstractions) used in electrical devices (e.g., CPUs, GPUs, ASICs, FPGAs, memory, registers, and other digital circuit components) use a digital, clocked scheme for storing data and performing operations. However, progress in making improvements to these classical components has stagnated as progress on transistor design and performance has slowed.

While much of the innovation in the computational field has recently been aimed at improvements in the lower levels of existing computational stacks (e.g., adding processing cores, more application-specific co-processors, memories adapted for specific functions, etc.), the inventors have reassessed and developed a fundamental change to how data is encoded in physical states and propose practical frameworks for leveraging this change into usable constructs. For example, the present disclosure deals with various implementations that use arrival-time encoding schemes, such as race logic. This provides significant advantages in efficiency and other measures of computational success.

An arrival-time encoding known as race logic is described herein. Since digital transitions (edges) account for much of the energy consumption in traditional computation, race logic encodes multi-bit information in a single edge per wire. The arrival time t of this single edge is the value encoded by the signal. Encoding multiple bits on a single wire makes some operations very simple to implement. Standard AND and OR gates naturally implement the max and min functions; a unit delay element acts as an INCREMENT gate. A fourth logic gate, INHIBIT, allows its first (inhibiting) input to block the second input signal if the inhibiting signal arrives earlier. These operations are shown operating on example inputs in FIG. 5. As shown in FIG. 5, graphical examples of three race logic primitive operations $Q=f(A, B)$ are shown. Above each example, a top row indicates the correspondence between logical connectives and tropical functions. The graph below each example shows waveforms of sample calculations. The first two panels show min and max functions. The next two panels show an INHIBIT gate, which allows input B to pass only if it arrives before A—this has no well-behaved analog in Boolean logic.

To date, development of race-logic-based architectures has been largely ad hoc. For example, race logic was first developed to accelerate dynamic programming algorithms, and it has been proposed for applications including some proposed uses in various types of software networks (e.g., machine learning). However, device technologies have lagged and thus, this encoding scheme is still not generally adopted or feasible. It would therefore be desirable to have a practical, systematized method of building computer architectures that utilize race logic encoding, and to have a compositional framework for linking low-level subroutines (which can utilize time encoded components) into higher-order functions. Important building blocks for implementation of a computer architecture relying on time-encoding would be a time-encoded memory and a time-encoded method for developing operational components like state machines.

SUMMARY

The present disclosure provides systems and methods for implementing memory and computational circuit components, and combinations of these components, via temporal encoding and/or race logic.

In one implementation, a temporal memory is provided, which comprises: a group of tunable delay components in electrical communication with a set of input lines and a set of output lines; a write circuit connected to the tunable delay components such that an electrical signal can be controllably applied to each of the tunable delay components in correspondence with relative timing of a set of arriving wavefronts at the input lines associated with the tunable delay components, wherein the set of arriving wavefronts temporally encode data in their relative delay; and a read circuit connected to the tunable delay components such that an output signal can be controllably conducted through the tunable delay components so as to cause a set of memory recall wavefronts to be generated at the set of output lines having a relative delay corresponding to the relative delay of the set of arriving wavefronts.

In another aspect, the present disclosure provides a temporal state machine comprising: a temporal computational unit comprising at least one circuit to perform a time-domain operation; a temporal memory unit; and circuitry to electrically couple memory output lines and memory input lines of the temporal memory to the computational unit; wherein the computational unit and temporal memory unit are electrically coupled such that the computation unit can access time-encoded memory recall wavefronts from the temporal memory to perform the time-domain operation, and output time-encoded output wavefronts.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 5(a) is a conceptual graph of operations that may be performed in race logic.

FIG. 5(b) is a conceptual graph of operations that may be performed in race logic.

FIG. 5(c) is a conceptual graph of operations that may be performed in race logic.

FIG. 5(d) is a conceptual graph of operations that may be performed in race logic.

DETAILED DESCRIPTION

Various systems and methods are disclosed herein for overcoming the disadvantages of the prior art. The systems and methods herein implement various features and aspects that make them useful for any situation in which it would be beneficial to implement computational components or architectures in the time domain. For example, these systems and methods could find application via a memory component or network of memory components. Alternatively, they could find application in other computational components, such as state machines and various logic elements.

Considered in one sense, the three pillars that form the foundation of a computing system are computation, input/output (I/O), and memory. The present disclosure relates to circuits and associated architectures, methods, and constructs that allow for data storage (memory) and various architectures for low level computational tasks, natively in the temporal domain.

The temporal domain allows for different encoding schemes, among which two general categories are contemplated. One is a timing code, where the exact delays between electrical "spikes" within a circuit carry information. A more relaxed version of such an approach, though less dense in coding space, is a rank order code, in which only the relative orderings of the spikes carry information. Though sparser than its exact timing counterpart, order codes can contain appreciable information capacity while still maintaining robustness to variations in individual spike timing.

Figure 1A:
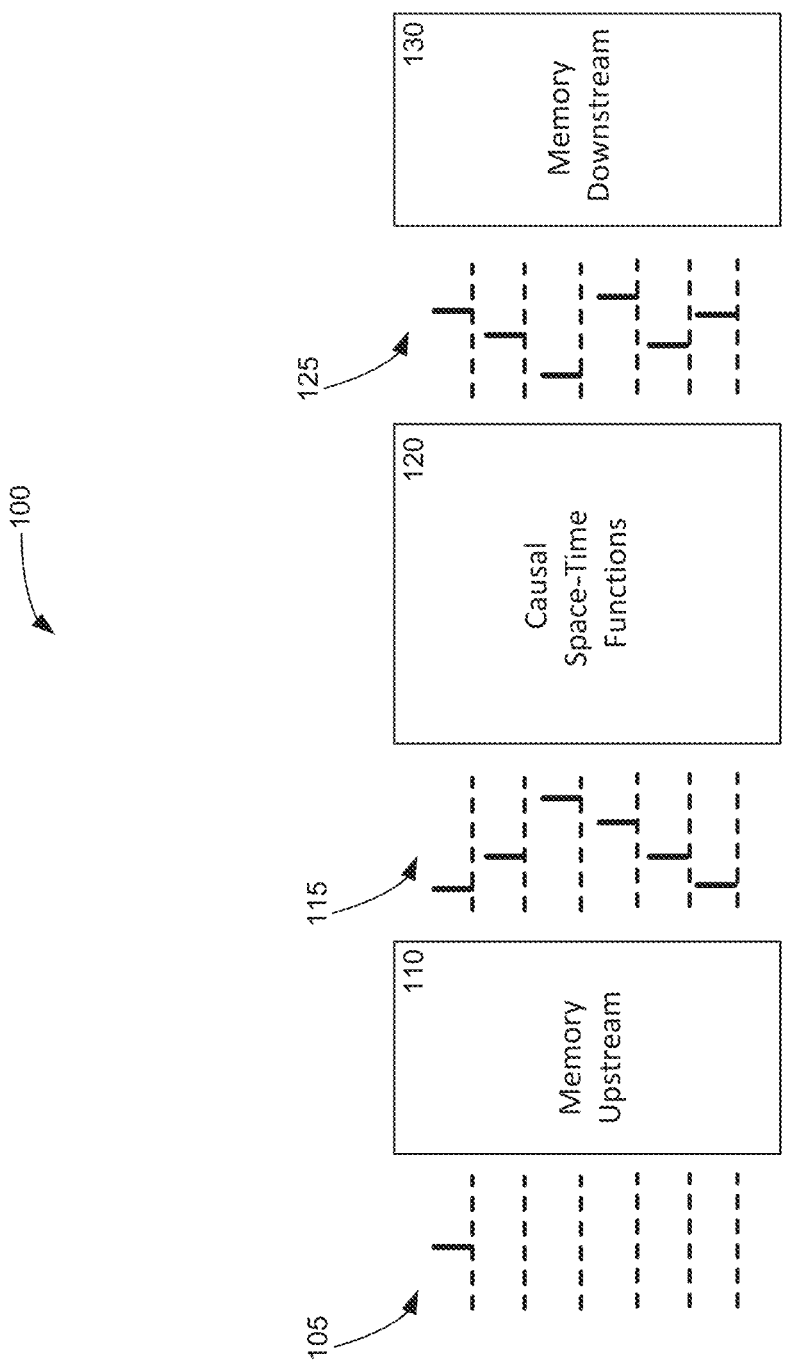
FIG. 1(a) is a conceptual diagram of temporal computation procedure, showing how temporal logic is used to encode and store information before and after temporally-implemented functions.
Figure 1B:
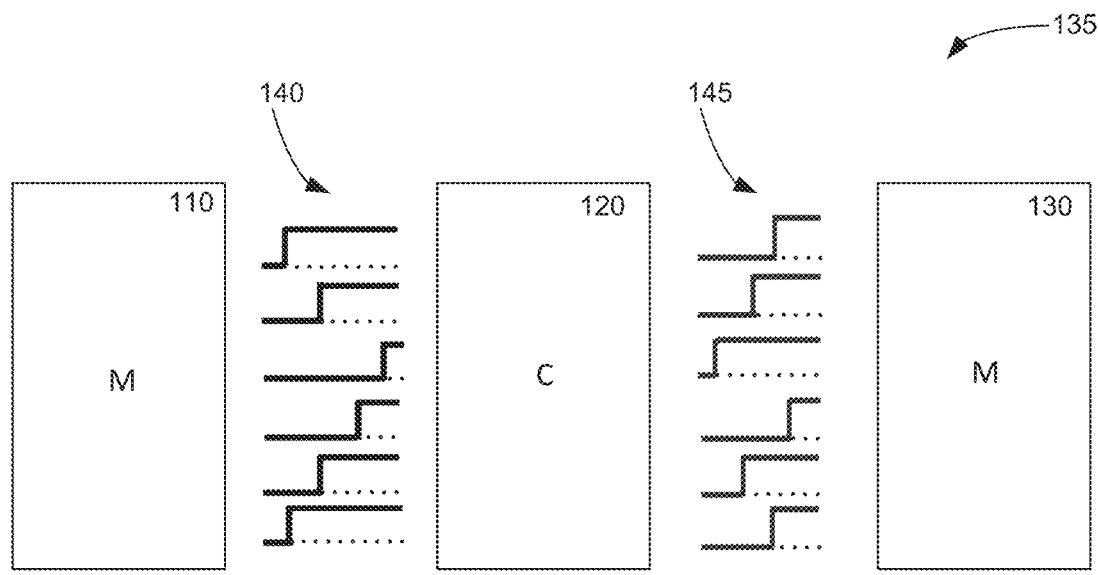
FIG. 1(b) is a conceptual diagram depicting temporally-implemented computational circuits and memories that represent events with digital rising or falling edges.
Figure 1C:
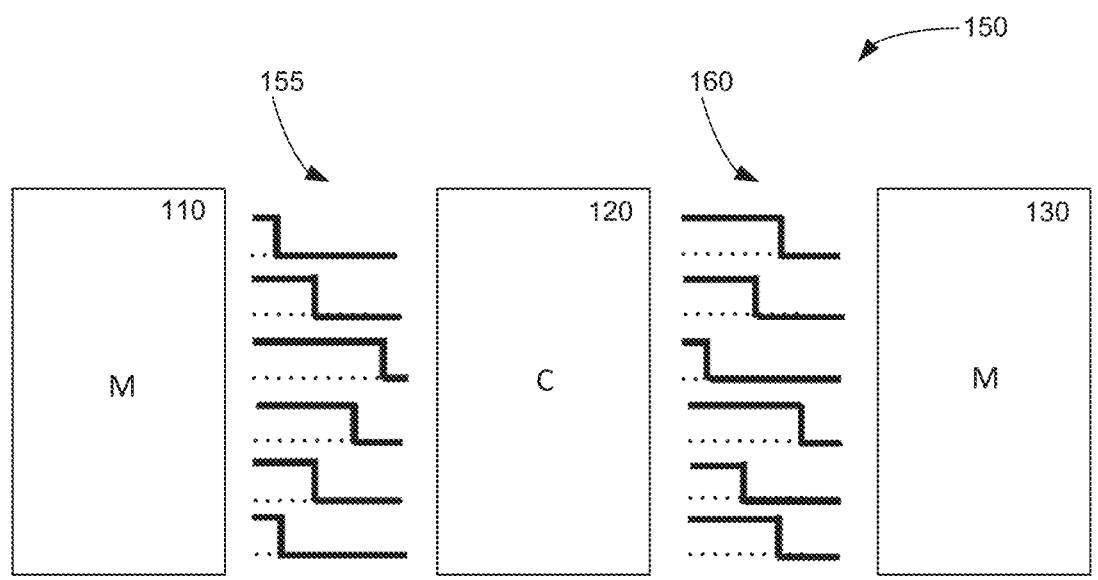
FIG. 1(c) is a conceptual diagram depicting temporally-implemented computational circuits and memories that represent events with digital rising or falling edges.

Race Logic is another category of temporal coding. It is a temporally coded logic family that takes advantage of the simplicity of the digital domain and represents events with rising or falling digital edges (as shown in FIGS. 1(b, c)), instead of spikes. FIG. 1(b, c) show rising and falling edge versions of architectures of such a temporal computer, built using the Race Logic encoding scheme. Computations can be initiated by a memory access to the upstream memory, which recalls a stored temporal wavefront. This wavefront flows through computational units that implement various causal functions. And, the wavefronts accessed from a memory can be utilized by these time-domain computational units to perform general computational functions (e.g., max or min functions, etc.) as well as specific algebraic operations as described below. Downstream memory can then get triggered to capture resulting wavefronts.

The present disclosure will describe developments and implementations in both logic/computation as well as memory. Various types of circuits and computational constructs can then be developed leveraging the features disclosed herein.

With respect to computational architectures, a suitable mathematical foundation that can express problems uniquely suited to a race logic approach is needed for progress in this field. For example, a mathematical algebra in which race logic algorithms and state machines are naturally expressed in the highly parallel dataflow contexts typical of temporal computing accelerators are desired. This disclosure presents various methods for achieving this, including embodiments that utilize tropical algebra as a foundation for implementing computational functions in a time domain, race logic context.

Building upon basic foundations, a compositional framework for programmatically linking low-level subroutines into higher-order functions is also disclosed. This development expands race logic beyond one-shot application-specific circuits. Having memories that can directly interface with the temporal domain, allows for read and write operations in such a memory can be performed without conversion to digital encoding, as described herein.

The introduction of temporal memory technologies herein allows race logic to serve as an efficient computational construct. A temporal computer equipped with a temporal memory is no longer subject to the invariance constraint on time-coded functions. Lifting this restriction allows for new, and more suitable mathematical foundations (e.g., tropical algebra) to serve as a coherent context for designing and interfacing race logic circuits. Temporal memories also allow for the building of more general-purpose, and complex architectures, beyond specialized one-shot temporal computations. Primitive race logic operations can be composed and iterated upon by saving outputs of one circuit and rerunning that circuit on the saved state, the temporal equivalent of a classical state machine.

Application of Race Logic Principles

As described herein, race logic can be thought of as a regime that uses biologically inspired wavefronts (as opposed to prior techniques using timing relationships between spikes) as the fundamental data structure, while using conventional digital CMOS circuits to compute. Race logic encodes information in the timing of rising digital edges and computes by manipulating delays between racing events. In contrast, in the conventional Boolean domain, the electrical behavior of wires changing voltage from ground to $V_{dd}$ is interpreted as changing from logic level 0 to logic level 1 at time t. In race logic, these wires are understood to encode each t as their value, since the rising edge arrives at t with respect to a temporal origin at t=0. (In some cases, a voltage edge can fail to appear on a wire within the allotted operational time of a race logic computation. In these cases, we assign the value temporal infinity, represented by the ∞ symbol.)

Some description of the background or existing perception of race logic as applied to circuit design will be helpful. Most discussion of race logic involves consideration of this scheme without memory—this can be called "pure race logic" design. The classes of functions that are candidates for implementation in pure race logic is constrained by physics through causality and invariance. For example, any output must be caused by an input that arrives prior to or simultaneous with the output; and outputs are invariant in the sense that they will output a result regardless of temporal origin of the input.

However, the various embodiments described in the present disclosure is not subject to theses constraints because they utilize memory. Thus, designs using the concepts of the present disclosure can be thought of as "impure" or "state" based race logic. Circuits using the principles described herein can perform differently at different times, depending on whether a memory element has been modified. From a programming perspective, a pure function always gives the same output when presented with the same input; an impure function is analogous to a subroutine that can access and modify global variables.

Examples of Temporal Memory

Various embodiments that implement the concepts and advantages presented in this disclosure can be utilized in a variety of computational environments. For example, a temporal memory implementation could be interfaced with digital components, to store information that is temporally-coded, but which is converted to digital coding after being read, in order for processing by a typical digital processor. In other embodiments, a temporal memory implementation could be used in an all-temporal, or substantially-temporal computing environment.

In general concept, temporal memory embodiments can be configured so that their circuit components cause a timing difference or delay as between outputs (wavefronts) generated on output lines of the memory device during a read operation. The delays can be detected (either in an absolute sense or relative to the output of the other lines or relative to another independent event like a clock cycle(s)), and interpreted as encoded data stored by the memory. The data is "stored" in the temporal memory embodiments as electrical features of the device that cause the variable time delay in output, such as programmable resistance. In a sense, programming delay (or resistance) into a memory device can be thought of as akin to writing or encoding information into the memory. Both the "write" and the "read" functionality of a temporal memory can be performed using time domain information, or one or both of these operations can be facilitated using more typical digital/clocked circuits.

Therefore, using the techniques and designs described herein, a useful translation between static memory and timing signals can be achieved. In other words, data that is encoded through an event arrival can be captured in a static format, then regenerated/recalled with the same relative arrival information. This allows for temporal-based memory as well as operation and computational functions to be performed entirely in the time domain, wherein data is encoded not in the classic Boolean (high/low, clocked signals) sense but entirely in the temporal domain.

In some embodiments, the translation of time-encoded event information into static memory can be achieved using tunable memristor RC time constants. Example 1, below describes how 1T1R memristive crossbars and other circuit configurations can be used to create wavefronts that have been stored in them that still retain the same time-encoded arrival information. Such an approach can interrogate the memristive state with more energy efficiency than conventional techniques. In some embodiments, the relative timing information in a wavefront can be captured through standard digital circuit techniques, which then invokes specific write circuitry to tune the memristor resistances to the corresponding captured digital values. This domain shifting, from analog to digital and back, has significant overhead associated with it. An alternative embodiment in which a circuit can natively capture wavefronts directly into memristors is also described.

Implementation of temporal computing techniques as described herein allow for creation of advantageous features in a temporal memory circuit component. For example, a temporal memory is possible that operates in the sub 50 ns timing range while utilizing the low variability, low resistance states (10 kΩ to 40 kΩ) of memristive devices. The recalling/playback operation of such devices can have an energy cost of about 400 fJ per line, whose magnitude is independent of the device conductance. Some embodiments may implement rank order coded architectures to achieve advantageous error tolerance. As described herein, embodiments of temporal memories can serve as foundational building blocks of temporally-coded computing architectures.

Figure 2A:
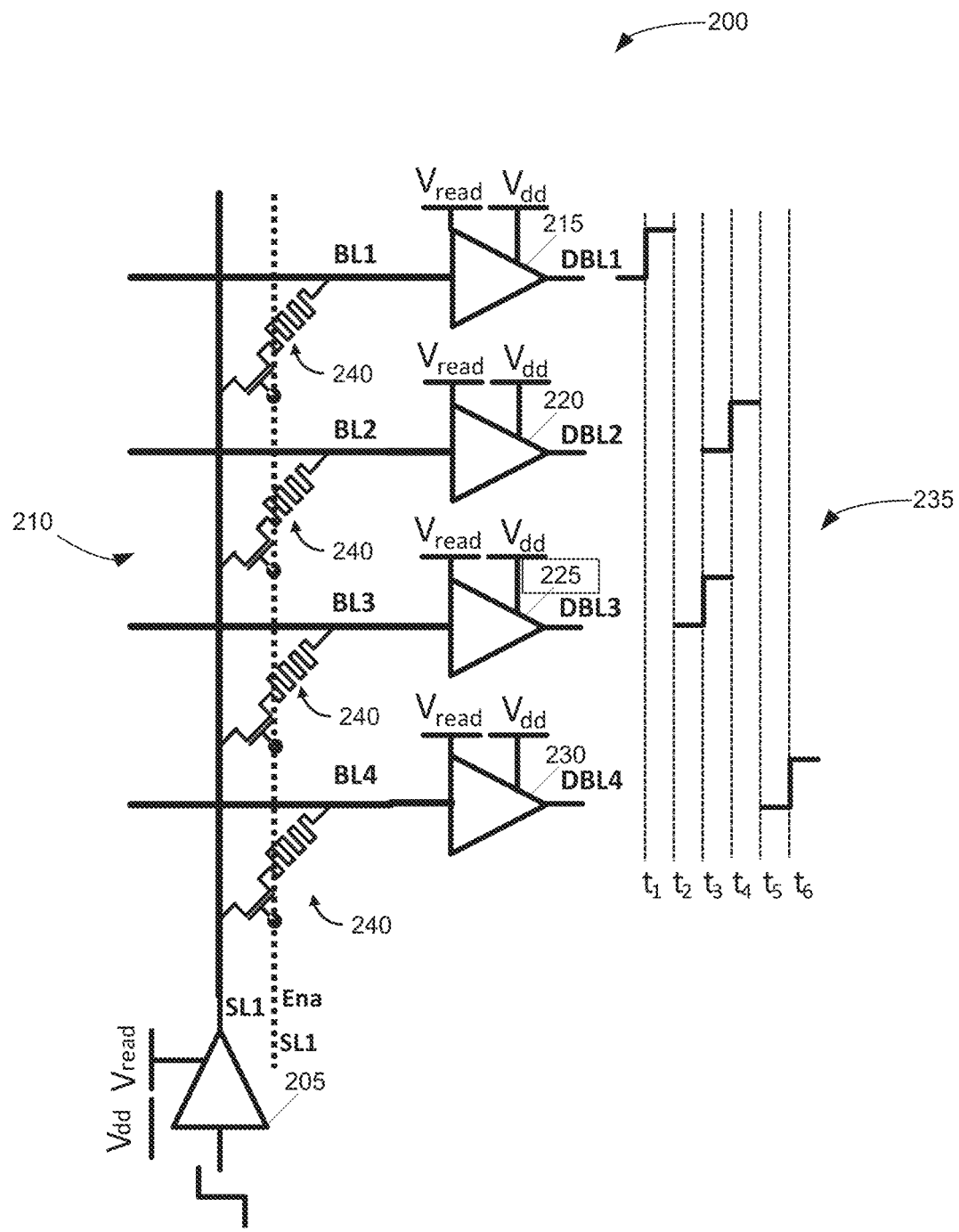
FIG. 2(a) is a conceptual schematic showing a single column temporal memory circuit performing a read/recall operation.

In one embodiment, a temporal memory can be used in a temporally coded environment where rising edges are used to demarcate events. Referring now to FIG. 2(a) a single column 210 of a scalable temporal memory architecture 200 is shown. The architecture 200 uses a 1T1R memristor crossbar 240, though other components could also be used to achieve the functionality described herein. For example, one approach could be to use programmable CMOS-only delay elements. Another approach could be to use magnetic domain wall memories, which also behave like delay elements. As shown in FIG. 2(a), each row behaves as an output bit line 215, 220, 225, 230 and the column behaves as the input source line (designated as "SL1"), however it is to be understood that such a 2D orthogonal structure is not required and other orientations (e.g., vertical and horizontal, through layers of a chip, at non-perpendicular angles, etc.). When a rising edge (e.g., a line goes "high" or moves to an elevated voltage) arrives through an enabled source line SL1, it charges the output bit line (BL1-4) capacitor, through the memristor, until a threshold is reached, causing a rising edge at the digital bit line (DBL).

Figure 2B:
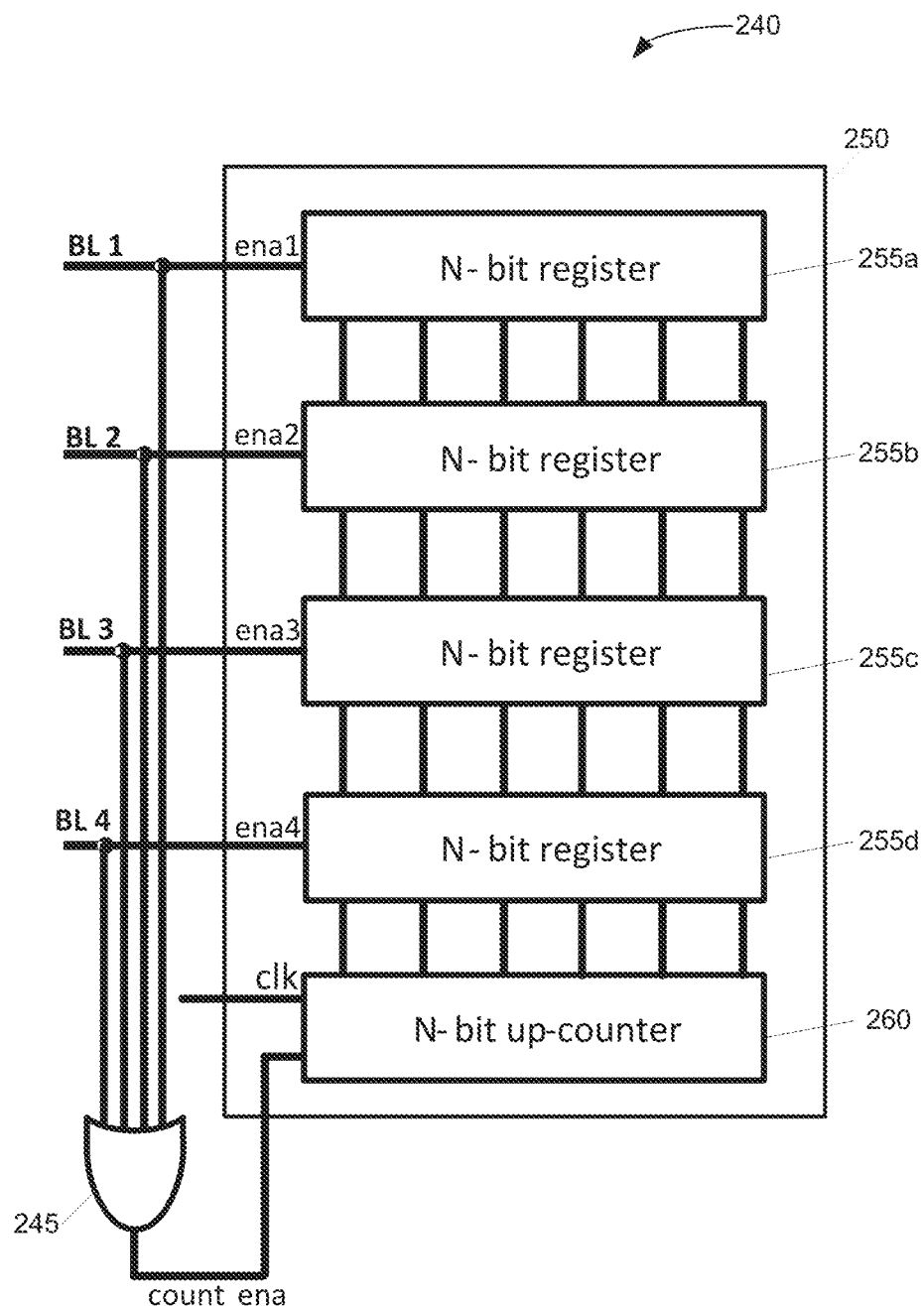
FIG. 2(b) is a conceptual schematic showing a detection circuit for detecting and storing incoming wavefronts from bitlines.

A read/recall operation is shown in FIG. 2, wherein a rising edge is presented at the input of the source line driver 205 (in the configuration shown, this is a levelshifter). This results in different charging rates of the various bit lines BL1-4, determined by the respective cross-point devices 240, resulting in an output wavefront. This wavefront enters the bitlines of FIG. 2(b) where the OR gate 245 detects the first arriving edge, starting the up-counter 260. The incoming rising edges on the bit lines BL1-4 latch the counted values and hence store the incoming wavefront as a digital value in N-bit registers 255a-d. Therefore, it is to be recognized that the embodiment in FIG. 2 leverages both some components operating in a temporal domain, as well as some components (e.g., the registers 255 and counter 260) that operate in a classical digital/Boolean regime. In other words, the binary/bit values stored in the N-bit registers 255a-d will correspond to the difference in time of arrival of the outputs of the temporal memory column on bit lines BL1-4.

Using such a circuit 200, the values of the memristive states can be directly read out as a wavefront of digital rising edges, also known as wavefront recalling. This is shown in the graph portion of FIG. 2(a), where a linear variation in memristive values leads to a linearly spaced output wavefront. The way in which memristive components 240 are used in this configuration differs in some important ways from conventional approaches. When used in a multilevel memory or feed-forward inference context, a static read voltage is applied across the device (pinned with a sense/measurement amplifier) while the resultant current is summed and measured.

Hence, the energy efficiency in these approaches improves the larger the $R_{on}$ and $R_{off}$ resistances become. In contrast, in this RC charging based recall mode of operation, the voltage drop across the device is not static, because the voltage on the output capacitor changes during a read operation (See FIG. 4(b)(iii)). This changing voltage has several advantages. First, it decouples the energy cost per read operation from the value stored in the memristor. Independent of the state of the device, a single read operation consumes $CV_{read}^2$ ($\approx$400 fJ) of energy per line, with $CV_{read}^2/2$ lost due to joule heating across the memristor and $CV_{read}^2/2$ stored on the capacitor. This data independent energy cost allows memristors to be used in the high conductance regime, without incurring the typical energy cost. Circuit and architectural designs can then take advantage of the high conductance regime, where the behavior of the device is more linear, repeatable and less susceptible to variation. Recently, for very low resistance states, the device to device variation has been shown to be ≤1%.

Another advantage is that the degree of read disturb on the device is reduced as the full read voltage is applied across the device for a relatively short period of time. To enable easy interface with digital signal levels, levelshifters can be used to translate between the computational digital voltage levels, and voltage levels that are compatible with memristive devices. This involves, shifting down from $V_{dd}$ to $V_{read}$ and back up to $V_{dd}$. This shifting down process can be implemented with regular inverters but the shifting up process may utilize either current mirror based level-shifters or cross coupled level-shifters. The current mirror based designs have a smoother response, and consume static power while the cross coupled versions are more power efficient, but have a more complicated response.

Figure 3:
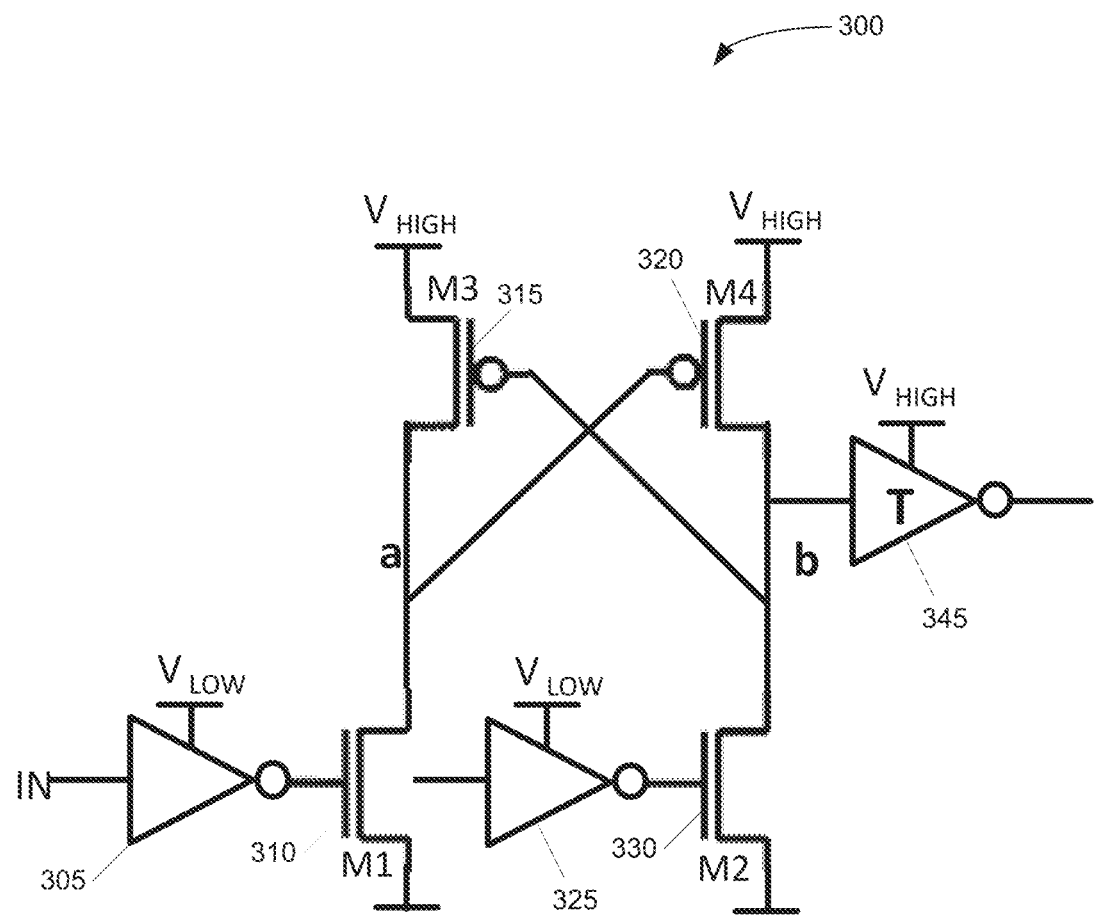
FIG. 3 is a circuit schematic for an example of a rising edge level shifter.

Referring now to FIG. 3, a cross coupled topology/configuration is shown. FIG. 3 depicts a circuit diagram of an asymmetric rising edge level shifter 300. The transistor M2 is sized larger than its counterpart M1 such that node "b" is pulled down faster with little competition from M1 via node "a". The inverter with a "T" represents a tri-state buffer 345. This circuit in FIG. 3 is representative of a positive feedback loop between transistors M1-M4. This positive feedback loop itself has a time constant that varies with the current charging the input node. This variable time constant can add timing uncertainties that are data dependent and could cause errors. Some implementations can mitigate this problem by taking advantage of the one sided nature of this information encoding. Using rising edges only determines the transistor that is responsible for the pull-down so it can be sized accordingly larger. This approach makes the response of the level shifter more uniform.

In some embodiments, digital circuit techniques as shown in FIG. 2(b) can be used to record wavefronts. High speed upcounters can be used for time scales on the order of 1 ns to 50 ns, and vernier delay lines, which extend the precision to the order of a single-inverter-delay, can be used for more precise measurements. Using Race Logic principles, the first arriving edge is detected with an OR gate, which signals the beginning of the timing measurement system (counter or Vernier delay line). With each subsequently arriving rising edge, the corresponding count value is captured in a register bank. An AND gate signals the last arriving input, at which time the recording process comes to an end with a digital representation of the relative arrival times with stored in a temporary register bank. These values can be used as targets for a closed loop feedback programming approach that writes the corresponding values into the correct memory column.

In other embodiments, using the variation of memristor resistances resulting from applied current pulses, the energy efficiency of wavefront recording is increased by eliminating the need to translate between encoding domains. In other words, a "native" time domain approach can be used. This native approach to capturing wavefronts, which exploits the close relationship between memristors and STDP, results in a natural and energy efficient implementation. In a time coded information representation, in which the value of the memristors explicitly codes for delay, STDP-like behavior can be used to record wavefronts. In this approach, the circuit applies pulses of variable lengths across the memristors proportional to the difference in timing between the first arriving event and the event in question. When a wavefront is then recalled, the highest conductance device responds first and the most resistive one responds last, preserving the wavefront shape/timing.

Figure 4A:
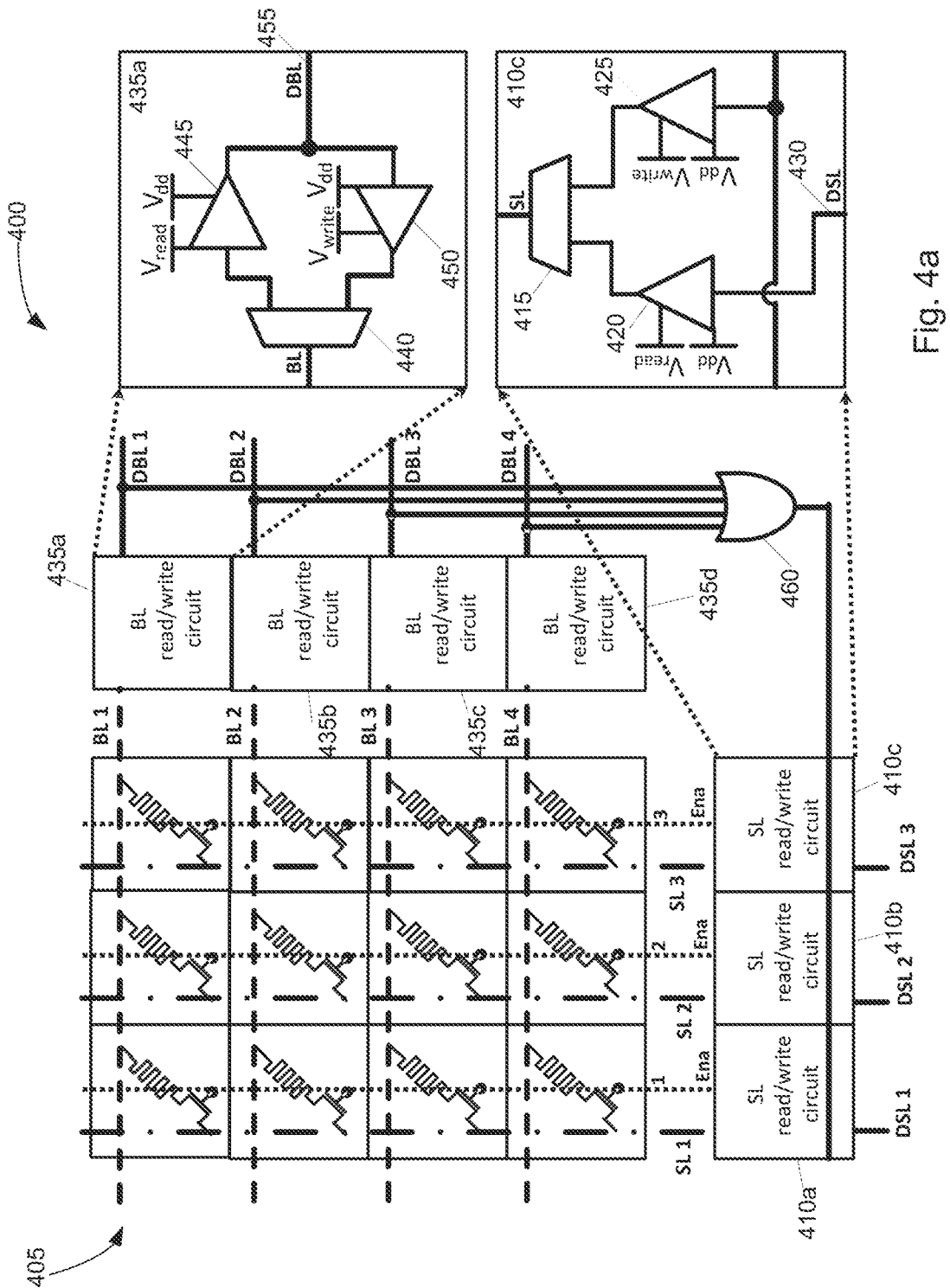
FIG. 4(a) is conceptual schematic of a temporal memory array, with detailed expanded views of read/write circuit units.
Figure 4B:
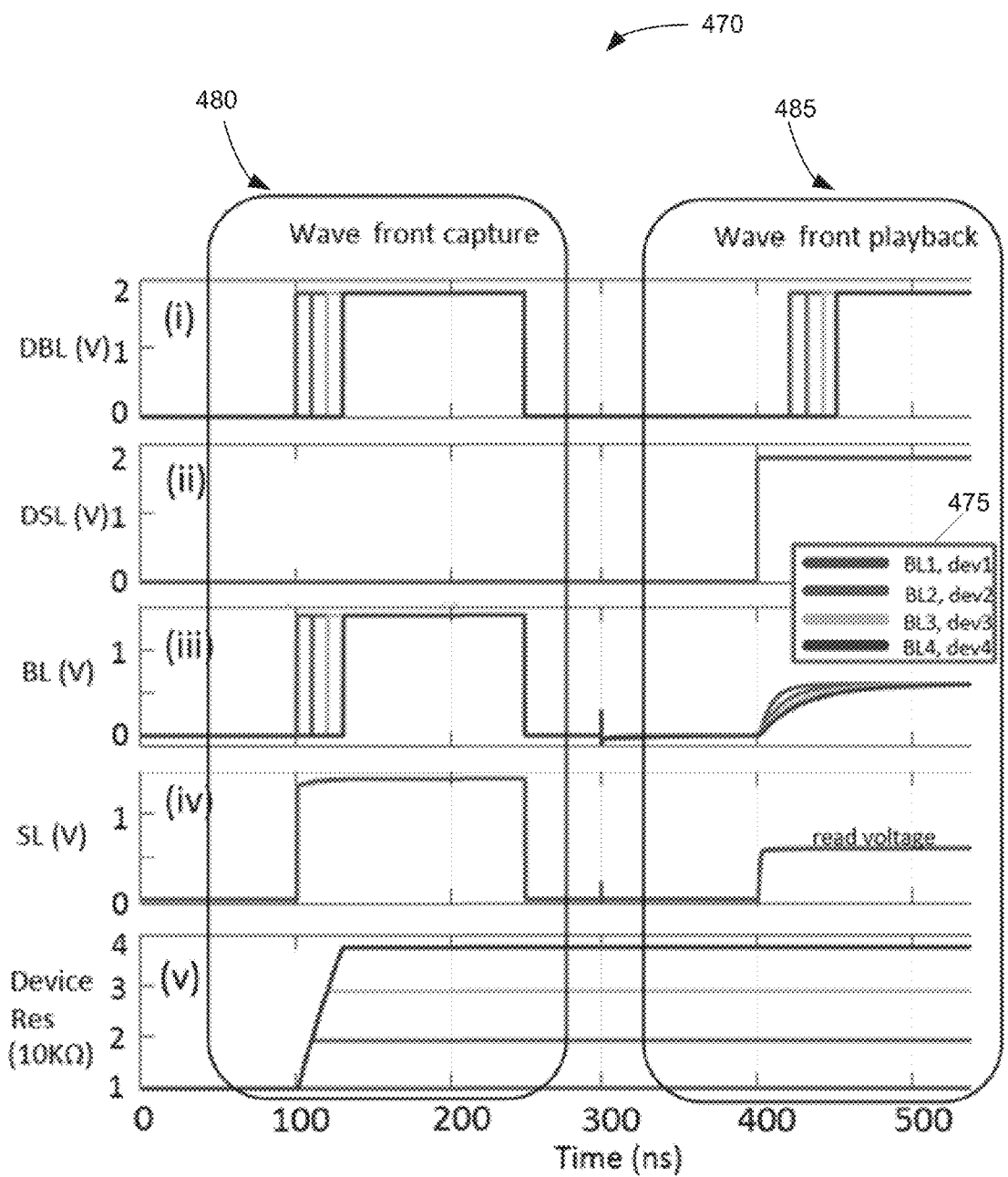
FIG. 4(b) is a set of graphs showing example operations performed via a temporal memory array.

Referring now to FIG. 4(a), an exemplary circuit structure 400 is shown that achieves some of the advantages described herein. As shown the structure 400 implements a 3×4 resistive temporal memory. An 1T1R array 405 is shown, in which a memristor cross bar connects to row and column lines. The lowermost 410 and rightmost 435 grouping of cells represent the source and bit line augmentations that allow for use of such an array in a temporal context. These cells 435 and 410 are read/write circuits. A zoomed-in depiction 435a, 410c of a cell from each grouping is also shown, in order to show the level shifters (digital) and read out cells (tri-state). The multiplexers 440, 415 that determine the read/write circuit paths are pass gate based.

To write data to the memory device, the bit-lines (BL1-4) are used as inputs, and the source lines (SL1-3) are controlled by the OR gate 460 through the write path of the multiplexers 440, 415. Given the OR gate 460, so long as any BL is high, the SLs will also all be high. Therefore, when any given BL is low (but at least one other BL is high, thereby triggering the OR gate and the SLs), a voltage difference across a memristor coupled to that BL will be present, which will cause a change in the resistance of the memristor. As described below, there may not be a completely linear change in resistance, depending on materials used. After a given period of time at which all BLs are high, they will all drop to low at the same time. During read/playback, the source lines SL1-3 are used as the inputs, with the bit lines BL1-4 being the outputs, with the multiplexers 440, 415 operating in the read path. When the source line goes high (for all columns/rows), the memristors at each node in the array 405 will cause a delay in the time it takes to output onto the BL—and the delay will reflect the programmed delay caused by the wavefront differences during the write phase. Thus, the multiplexers allow for the SL and BL to be used differently for the read phase versus the write phase.

Simulation results for such a procedure are shown in FIG. 4(*b*) for the wavefront capture (write) phase 480 and wavefront playback (read) phase 485. These simulations are performed in a 180 nm process node, with a 1.8V power supply. The memristor models used were metal-oxide-based resistive random access memory (RRAM) devices and were modelled based on experimental measurements. The wavefront recording operation proceeds by first initializing the column in question, (column 1, shown in FIG. 4(*a*)), with all memristors set to the ON state ($\approx$10 k$\Omega$) and the enable line (Ena1) activated. This can be seen in the first 100 ns of FIG. 4(*b*)(*v*) with all devices having the same impedance. The write path through the multiplexers, as shown in FIG. 4(*a*), is also activated, such that the OR gate controls the source line (SL). The wavefront (having a dynamic range of 40 ns) to be recorded is presented at the digital bit lines (DBLs), which behave like the input in this phase of operation. Similarly to the digital case of FIG. 2, the first arriving rising edge is detected by an OR gate, which triggers the application of an appropriate write voltage ($V_{write} \approx 1.4$ V), through the multiplexer, to the source line (SL). The bit-lines (BLs) of the array are operated in the write voltage regime with rising edges level shifted down from $V_{dd}$ to $V_{write}$. Each device sees the difference in voltage between the source line (FIG. 4(*b*)(*iv*)) and corresponding bit lines (FIG. 4(*b*)(*iii*)) applied across it. For the tunable delay device corresponding to the first arriving edge, both its source line and bit line go high at the same time, so there is no change in the memristive state. On the other hand, for the other tunable delay devices, for which the edges have not arrived yet, a reverse $V_{write}$ voltage is applied across them for the difference in time between the arrival of their corresponding edge and the first arriving edge, causing a change in the memristive state proportional to the relative times between the inputs.

Once the recording operation is complete, the last arriving edge has its corresponding device experience the longest write pulse and hence has a maximal change in state and is the most resistive, while an intermediate device sees a proportional change in resistance. Similarly, after the appropriate pulse lengths have been successfully applied across the devices, a copy of the input wavefront should be captured into the memristive devices.

Some embodiments may experience various phenomena in the context of exact timing codes that it may be desirable to address. First, in some embodiments the relationship between memristor resistance and relative output timings for recalling the wavefront might be linear, arising directly from the t/RC relationship; but the relationship between memristor conductance and voltage pulse duration for recording the wavefront may not be not linear, and may depend on material properties. Since most memristive state change dynamics are governed by transitions over energy barriers, the effectiveness of a fixed voltage to change the device state drops logarithmically. In the wavefront recording process, a linearly spaced input wavefront will end up creating a logarithmically spaced resistive change, which when recalled would create a logarithmically spaced output wavefront. This problem is fundamental to some configurations, being governed by the exponential nature of Boltzmann statistics and energy barriers.

One way to get linear behavior out of such a device, is to cause it to operate in a regime where the Taylor series expansion of its behavior has small higher order coefficients, so that it can be approximated as linear. Such behavior can be seen for a range of voltages where a sharp pulse ($\leq$40 ns) across the device creates a linear change in the device's state (from 10 k$\Omega$ to 40 k$\Omega$), which tapers off if the pulse is applied for a longer time. Here, as shown in FIG. 4(*e*)(*v*), pulse duration is calibrated to access that specific linear region of the memristor characteristics, and therefore does not access the complete available dynamic range.

The reduced range is not detrimental and depends on the quality of the memristive devices being used. Five bit or more resolution is possible in limited resistance ranges with the low resistance state incurring, programming cycle to cycle variations as low as 4.2% and device to device variation as low as 4.5%. For very low resistances (between 1 k$\Omega$ and 10 k$\Omega$), even lower variation numbers are possible ($\leq$1%). Such technological improvements allow for the extraction of 4 to 5 bits of precision, even from a reduced dynamic range.

A second difficulty for exact timing codes is that the time scales of recording and of recalling should ideally match, or come close to matching, in some embodiments. For example, the resistance change created by 10 ns pulses in the recording process, should ideally create 10 ns spaced edges when recalled. While the former is a material property and won't be directly changed by circuit techniques alone, the latter can be addressed by adding digitally programmable capacitances ($\approx$1 pF, in the current simulation) on the output line to correctly scale the timescale. For small array sizes such a capacitance can take up extra area, but as the array is scaled to more representative sizes, the crossbar, transistor-drain and driver capacitances will contribute significantly to this capacitance. Scaling of the array is relatively straightforward, with the timing of the read drivers being correctly calibrated as described previously. The write drivers on the bit line do not need to be adjusted, but the source line write driver will have to be designed to support N memristors in parallel during the capture phase. A more detailed scaling analysis accounting for crossbar wire resistances and capacitances is also contemplated.

Neither of these problems are as significant concerns for rank order codes as they are for exact timing codes. Logarithmic compression preserves order, and variable capacitances can be used with order codes to stretch the logarithmically compressed stored values. This method allows enough write pulse duration to still change state on the next write operation. This makes rank order codes a more robust and error tolerant application for this kind of a temporal memory.

Accordingly, a number of configurations and implementations of a temporal memory have been shown and are contemplated. Some principles described herein are common to many embodiments: For example, a tunable delay component operable for one or more bit lines (e.g., some bit lines may be combined, and some may have fixed delay) of a memory is generally included, so that the tuned delay can correspond to the differences in wavefronts arriving at the memory. The tunable delay components can be circuits that provide RC delay. In some embodiments the wavefronts may be pulses of equal or similar voltage differential (e.g., "high" pulses akin to a digital environment), but delayed in time. Thus, as described above, tunable delay components "see" the incoming pulse delay differences by receiving a voltage differential for different periods of time. In the case of memristors as the tunable delay component, the resistance of the memristors is directly impacted by duration for which these voltage differentials are applied. However, in other embodiments, other time-based components of wavefronts may also be utilized to store time domain information in tunable delay components, and other tunable delay components could be used. For example a number of wavefronts that all arrive at a memory at the same time, but which have differing rise/fall times could also be used to program delay components in the same fashion. Likewise, a write component of the memory is also common to many embodiments. In embodiments described herein, these circuit components aid in translating the time differential of incoming wavefronts into an electrical feature that is applied to tune the tunable delay components. For example, as described above with respect to FIGS. 2 and 4, aspects of the circuits shown therein associated with the source lines cause a voltage differential across the memristive crossbar that corresponds to timing of arriving wavefronts. And, similarly, write/recall components of the memory devices allow for discharge of wavefronts along bit line outputs of the memory that are delayed according to the tuned delay components. In some embodiments, a rising edge is presented at a source line driver. In other embodiments, a stored charge can be used to generate rising edges for each output bit line.

Likewise, embodiments disclosed herein may operate according to similar modes of operation and methods for storing data. Generally speaking, in many embodiments a set of electrical input pulses (time domain-encoded, e.g., for race logic design, per the description herein) is received. The time delay characteristics of the pulses encodes data bits, with each pulse potentially encoding multiple bits (e.g., 4 or 5 bits, or up to 6 or 7 bits, or higher depending on sensitivity of the circuit components and materials used). The embodiments use these electrical input pulses to "tune" a set of delay components, in any of the techniques contemplated herein. For example they may program a CMOS-only circuit, or tune a memristor, etc. Once the tunable delay components have been tuned, they are in essence storing the encoded data bits. This is, as described above, a "write" or "store" phase of memory operation. Importantly, the temporally-encoded information is now made static, by the method. Then, at some point, when embodiments herein are to perform a "read" or "recall" operation (e.g., a memory is interrogated), then they generally will receive a read signal. In response to that read signal, embodiments herein generate an electrical output pulse for each of the delay components. As described above, there are several ways in which the output signals can be generated, e.g., by discharging capacitors, by applying read signals, by stepping down a $V_{dd}$ signal, etc. This signal is delayed by the delay components so that the embodiments can output a set of electrical output pulses having substantially the same relative time delay as the set of electrical input pulses. The foregoing method steps can be carried out by a variety of circuits and components, including the examples identified above.

Examples of Temporal Computational Components 2.1 Race Logic and Temporal Computing With the ability to make use of a temporal memory that can operate in the read and/or write phases in a time domain, general purpose computational constructs can now be created, as will now be discussed.

In this section, the present disclosure will describe various features, configurations, and advantages of time-domain computational circuits. For example, this section will describe:

a temporal state machine that solves temporal problems in systematized parts, providing a clear computational abstraction for building out processing capability for larger computations out of primitive race logic elements;

the use of tropical algebra as a mathematical framework for working with temporal vectors, including mapping into tropical algebra from race logic and how it provides a convenient mathematical setting for working with temporal computations;

augmentations to conventional 1T1R (1 transistor, 1 resistor) arrays that make the crossbar architecture natively perform fundamental tropical operations. (This can be used, along with other temporal operations, to create a more general feed-forward temporal computation unit; and an example and evaluation of a temporal state machine that uses Dijkstra's shortest path algorithm to find the minimal spanning tree on directed acyclic graphs.

2.2 Tropical Algebra

One suitable mathematical framework for constructing computational operations using time-domain components (as described herein), is tropical algebra. Tropical algebra deals with the tropical semiring $\mathbb{T}$, in which the operations of addition and multiplication obey the familiar rules of commutativity, distributivity, and so on, but are replaced by different functions. The tropical multiplicative operation is conventional addition, and the tropical additive operation is either min or max; the choice of additive operation distinguishes two isomorphic semirings. Depending on the choice of min or max as the additive operation, the semiring is given by $\mathbb{T}=(\mathbb{R}\cup\{\infty\}, \oplus, \otimes)$ or $\mathbb{T}=(\mathbb{R}\cup\{-\infty\}, \oplus', \otimes)$; $\pm\infty$ are included to serve as additive identities. (In contrast, the ring of real arithmetic is (R, +, x)). These symbols, and others used in this article, are collected for reference in Table 1:

TABLE 1

List of Symbols Related to Race Logic and Tropical Algebra and Their Meanings

| Symbol | Meaning | Description |
|---|---|---|
| $\infty$ | infinity | additive identity in tropical algebra; edge that never arrives in race logic |
| $\otimes$ | add | multiplicative operation in tropical algebra; temporal delay in race logic |
| $\oplus$ | min | additive operation in tropical algebra; first arrival in race logic |
| $\oplus'$ | max | alternate additive operation in tropical algebra; last arrival in race logic |
| ⊣ | inhibit | ramp function in tropical algebra; signal blocking in race logic |
| = | equivalence | expressing equality between two statements |
| := | storage | storing a signal in memory |
| ≅ | normalized storage | storing a signal in memory by first performing a normalizing operation |

There are some fundamental similarities between tropical algebra and race logic. Both of them have an ∞ element. In race logic, it physically corresponds to a signal that never arrives, while in tropical algebra it corresponds to the additive identity, since:

$$\alpha \oplus \infty = \min(\alpha, \infty) = \alpha. \tag{1}$$

Such an addition does not have an inverse, since there is no value of $\beta$ in $\min(\alpha, \beta)$ that would give ∞. The non-invertibility of addition means that this algebra is a semiring and fundamentally winner-take-all in nature. Every time the additive operation is performed, the smallest number (the first arriving signal in race logic) "wins" and propagates further through the computation. (Alternatively, $\oplus'$ could be chosen instead of $\otimes$, then the additive identity would be −∞.) However, in some embodiments, the min-plus version of tropical algebra provides more suitable utility. The multiplicative identity in tropical algebra is zero, rather than one, since $\alpha \otimes 0 = \alpha + 0 = \alpha$.

2.3 Graph Problems in Tropical Algebra

Figures 6A, 6B:
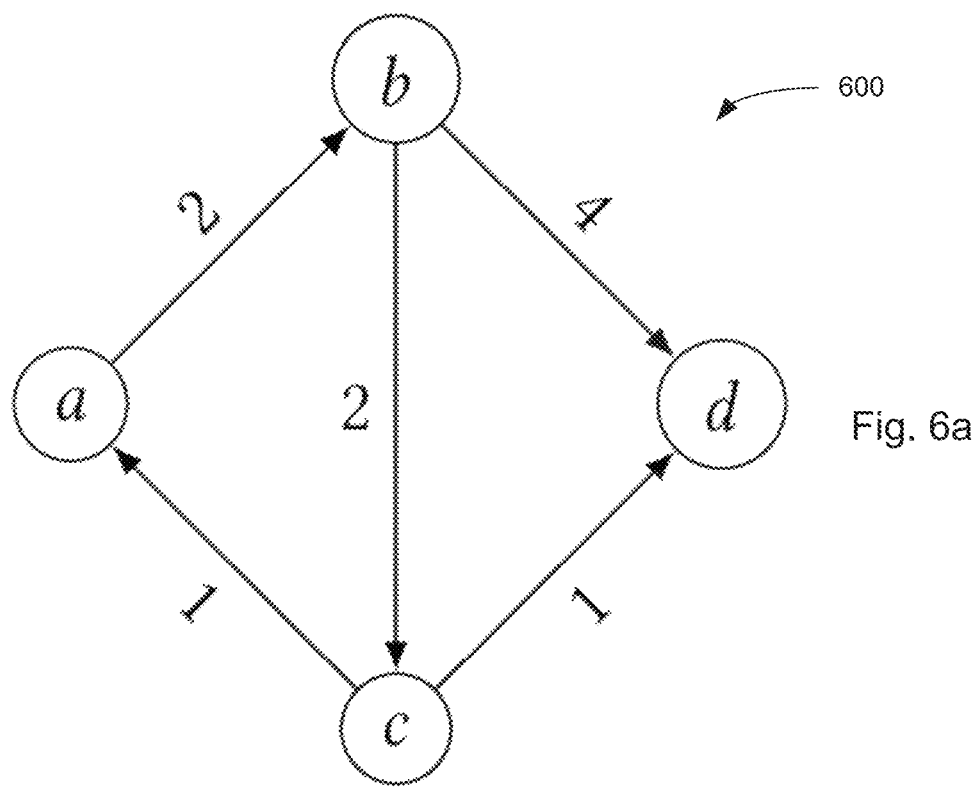
FIGS. 6(a)-6(f) are conceptual diagram of a tropical matrix for graph exploration.

Tropical algebra can be especially useful for graph analytics, where it provides a simple mathematical language for graph traversal. A fundamental concept in graph traversal is the graph's weighted adjacency matrix A. FIGS. 6(a) and (b) show a directed graph and its weighted adjacency matrix, respectively. The ith column of the weighted adjacency matrix represents the distances of the outward connections from node i to all other nodes in the graph, so $A_{ji}$ is the weight for the edge i→j. Where there is no edge to node i from j, we assign the value $A_{ji}=\infty$.

Figures 6C, 6D:
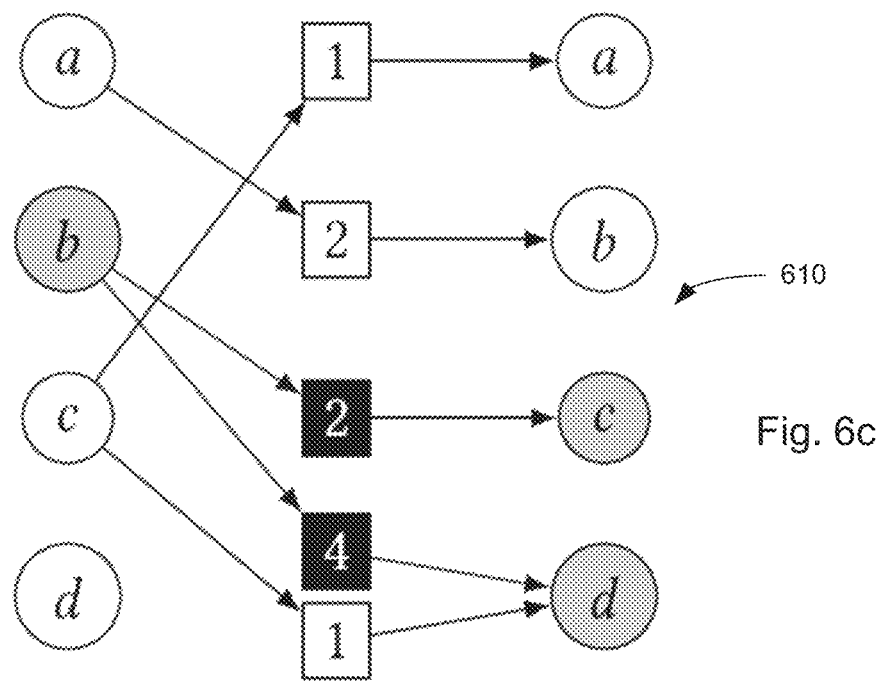
Figures 6E, 6F:
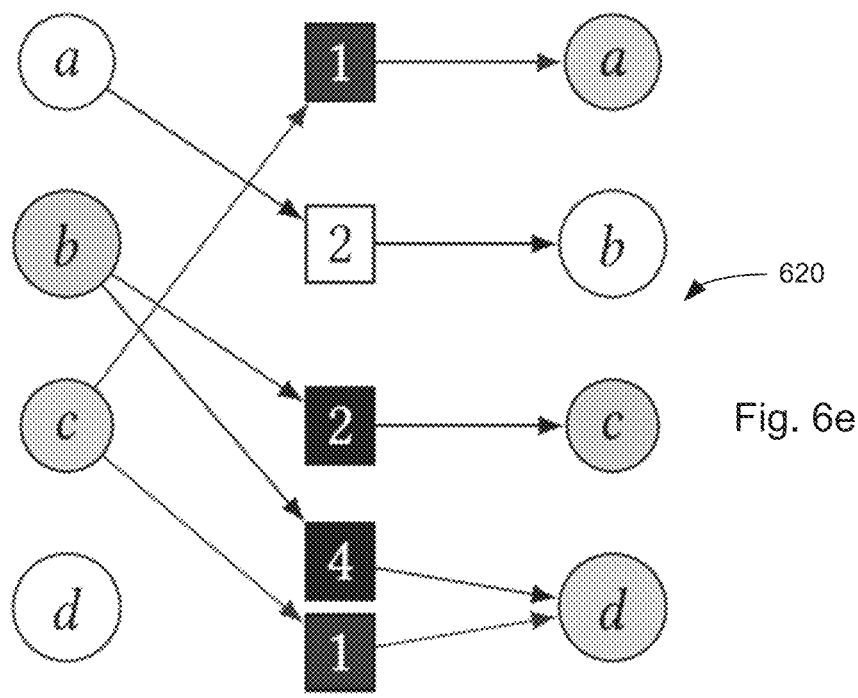

FIG. 6(a) shows an example directed graph 600, and FIG. 6(b) shows the equivalent weighted adjacency matrix. FIG. 6(c) shows the propagation of a signal originating at node b through a delay network corresponding to the edges of the example graph 610, and FIG. 6(d) shows the tropical vector-matrix multiplication 615 corresponding to FIG. 6(c). Graph 620 of FIG. 6(e) and tropical vector-matrix multiplication of 625 of FIG. 6(f) repeat these representations for the case where signals are injected at both b and c, as shown.

The usefulness of tropical algebra for graph traversal is seen when using A in a tropical vector matrix multiplication. Tropical vector-matrix multiplication (VMM) proceeds like conventional VMM, but with ($\oplus$, $\otimes$) instead of (+, ×). As shown in FIGS. 5(a)-(d), each vector element is scaled (tropical multiplication) before they are all accumulated (tropical addition). Extracting any single column from a matrix can be done by multiplying a one-hot vector, as shown in FIGS. 5(a)-(d). The tropical one-hot vector has a single zero element with all other entries set to ∞ (from Section 2.2 above). During scaling, the columns of the adjacency matrix that correspond to the infinities of the one-hot vector get scaled to infinity (tropically multiplied by ∞) while the remaining column, scaled by the multiplicative identity 0, is the output. The values stored in the output vector represent the distances from the one hot node in the input vector. This operation represents a search from the node in question (decided by the one-hot vector) to all the connected nodes in the graph and reports the distances along all edges of this parallel search.

Using a "two-hot" vector for input, as shown in FIG. 5(d) outputs a tropical linear combination of two vectors, corresponding to the "hot" columns of the adjacency matrix. The accumulation phase of the tropical VMM is nontrivial; the $\oplus$ operation selects the smallest computed distance to each node for the output. The tropical VMM reports the shortest distance to each node in the graph after a single edge traversal from either of the initial nodes specified by the two-hot vector. Both steps—the exploration of a node's neighbors and the elementwise minimum of possible parent nodes associated with an output—are performed in parallel by a single matrix operation.

Representing a collective hop through the graph as a single matrix operation allows a series of matrix operations to represent extended graph traversal. The shortest traversed distance to each node in a graph from an initial node x is:

$$y = x \oplus (x \otimes A) \oplus (x \otimes A \otimes A) \oplus (x \otimes A \otimes A \otimes A) \oplus \dots \tag{2}$$

The first term represents all single-hop shortest paths starting out from x, while the second term accounts for all the two-hop shortest paths, and so on. Hence, the tropical summation across all the terms my allows it to encode the shortest distances between the input node as specified by x, independent of the number of hops. Performing N such hops and calculating the minimum distance across all of them is the key operation in various dynamic-programming-based shortest path algorithms. This process makes tropical algebra the natural semiring for Dijkstra's algorithm. Later in this disclosure, an example is provided in which these ideas were used to implement Dijkstra's single-source shortest path algorithm in a stateful race logic system.

2.4 Embodiments Implementing Tropical Linear Algebra

Since tropically linear functions $\oplus_j (a_j \otimes t_j)$ with the $a_j$ values constant satisfy the invariance condition, tropical linear transformations may be carried out in pure race logic.

Above in this disclosure, a description is given for how single rising edges can be used to encode information in their arrival time. Interpreting the edges as tropical scalars, it can be seen how OR gates and delay elements are modeled by tropical addition and multiplication. This understanding can also be extended to tropical vectors. Section 2.3, above, describes how tropical vectors can be interpreted as distance vectors in graph operations. These distance vectors can be interpreted temporally as a wavefront or a volley of edges measured with respect to a temporal origin.

Just like conventional vectors, tropical vectors have a normalization rule, but it is somewhat unusual. Normalization proceeds by subtracting the minimum element of a vector from all elements, ensuring that at least one element of the normalized vector is equal to zero. It is common to regard a tropical vector as equivalent to its normalized version, implying that it only encodes information about the shape of its temporal wavefront, and not about an arbitrarily chosen temporal origin. To accept this equivalence is to work in the projective tropical vector space, and we refer to tropical vectors as being projectively equivalent if their normalized versions are elementwise equal. Frequent renormalization has the advantage of mitigating overflow, and simple circuit modifications that can be used to implement it are discussed in Section 3.1. We use and account for normalization algorithmically in Section 4.1, allowing us to encode information in a principled way that would nominally extend beyond our dynamic range.

Figure 7A:
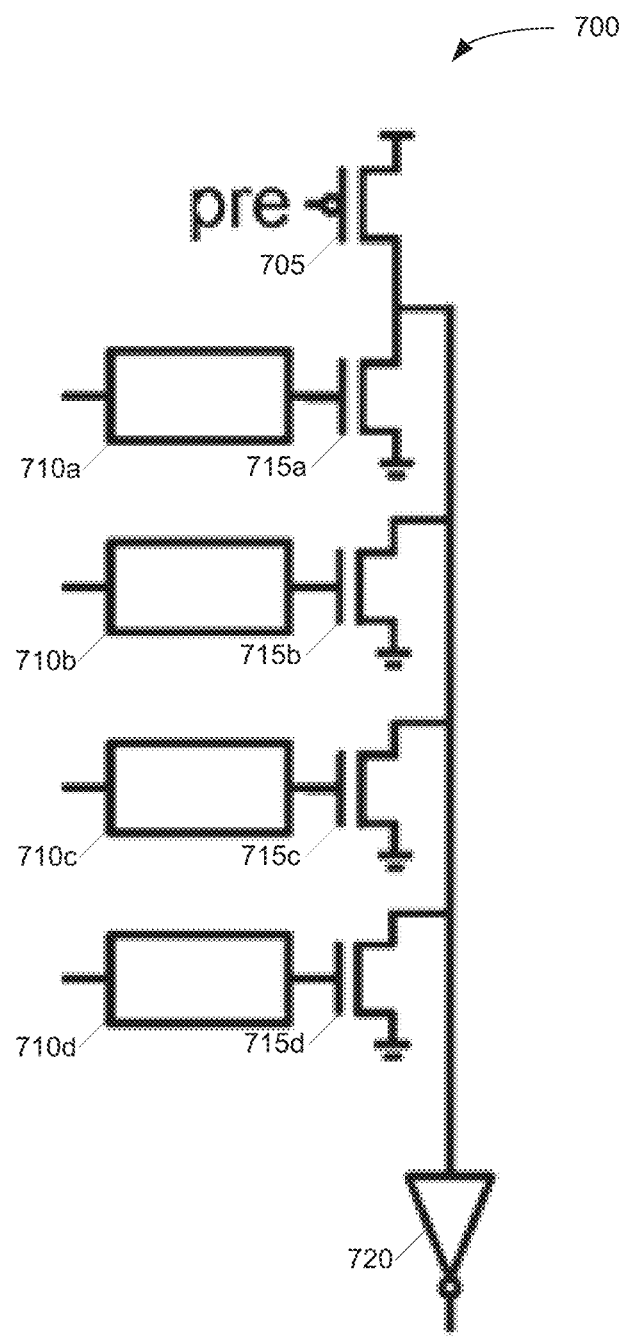
FIG. 7(a) is a conceptual schematic of a race logic circuit for performing tropical algebra functions.

Once a wavefront of rising voltage edges is interpreted as a tropical vector, the techniques shown in FIG. 7 can be used to implement tropical vector operations. FIG. 7(a) shows the vectorized version of the tropical dot product operation. As shown, the column of tunable delay elements 710a-710d delays each line of the incoming wavefront by a different amount. This implements tropical multiplication by constants and can be seen as superimposing the delay wavefront onto the incoming wavefront. The outputs of such a circuit are then connected to the inputs of a pre-charge-based pullup with an or-type pulldown network 715a-715d followed by an inverter 720. The circuit operation is divided into two phases, the pre-charge phase followed by the evaluation phase. In the pre-charge phase, the PMOS transistor has its input connected to ground, causing the critical node to be pulled-up (connected to $V_{dd}$). When the pre-charge phase ends, the PMOS transistor is turned off, which maintains the potential at the critical node at $V_{dd}$. During the evaluation phase, the first arriving rising edge at the input of one of the NMOS transistors causes the critical node to discharge to ground, hence being pulled-down to a potential of zero volts. This behaves as a first-arrival detection circuit that outputs a rising edge at the minimum of the input arrival times, performing the min operation. It implements tropical vector addition. Combining the delay (multiplication) with the min (summation), we get the tropical dot product operation. By replicating this behavior across multiple stored vectors, as in panel (b), we get the tropical VMM operation, where the input vector tropically multiplies a matrix.

In other words, in FIG. 7(a), an array of delay elements 710a-710d takes an incoming wavefront and delays its elements by the values stored in each of the delay elements. This represents the tropical element-wise multiplication by constant operation. The output is then connected to a p-type, metal-oxide semiconductor (PMOS) pre-charge pullup coupled with a NOR-style pulldown network that behaves like a first arrival detector and performs the tropical addition operation.

Figure 7B:
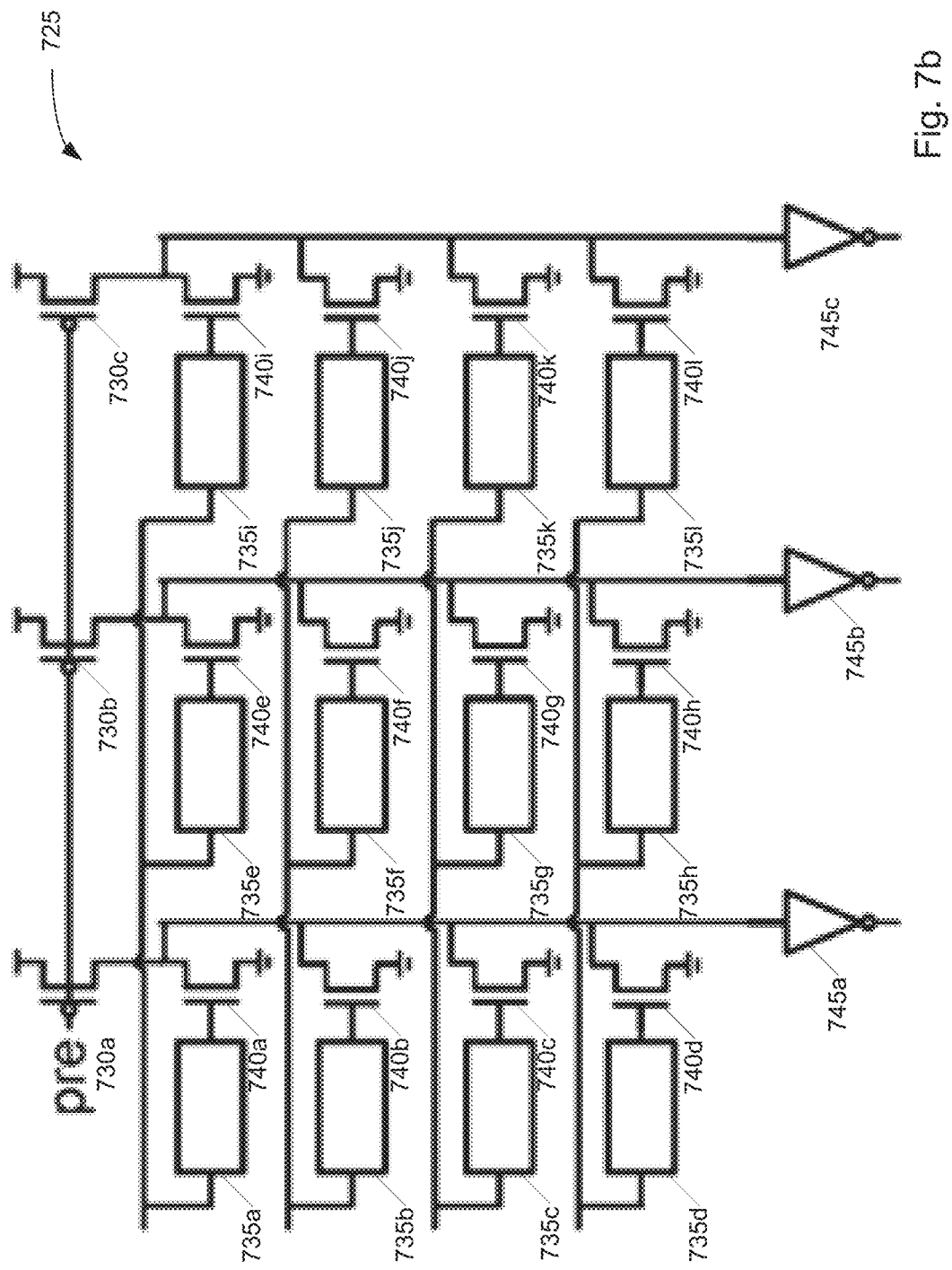
FIG. 7(b) is a conceptual schematic of a race logic circuit for performing tropical algebra functions.
Figure 7C:
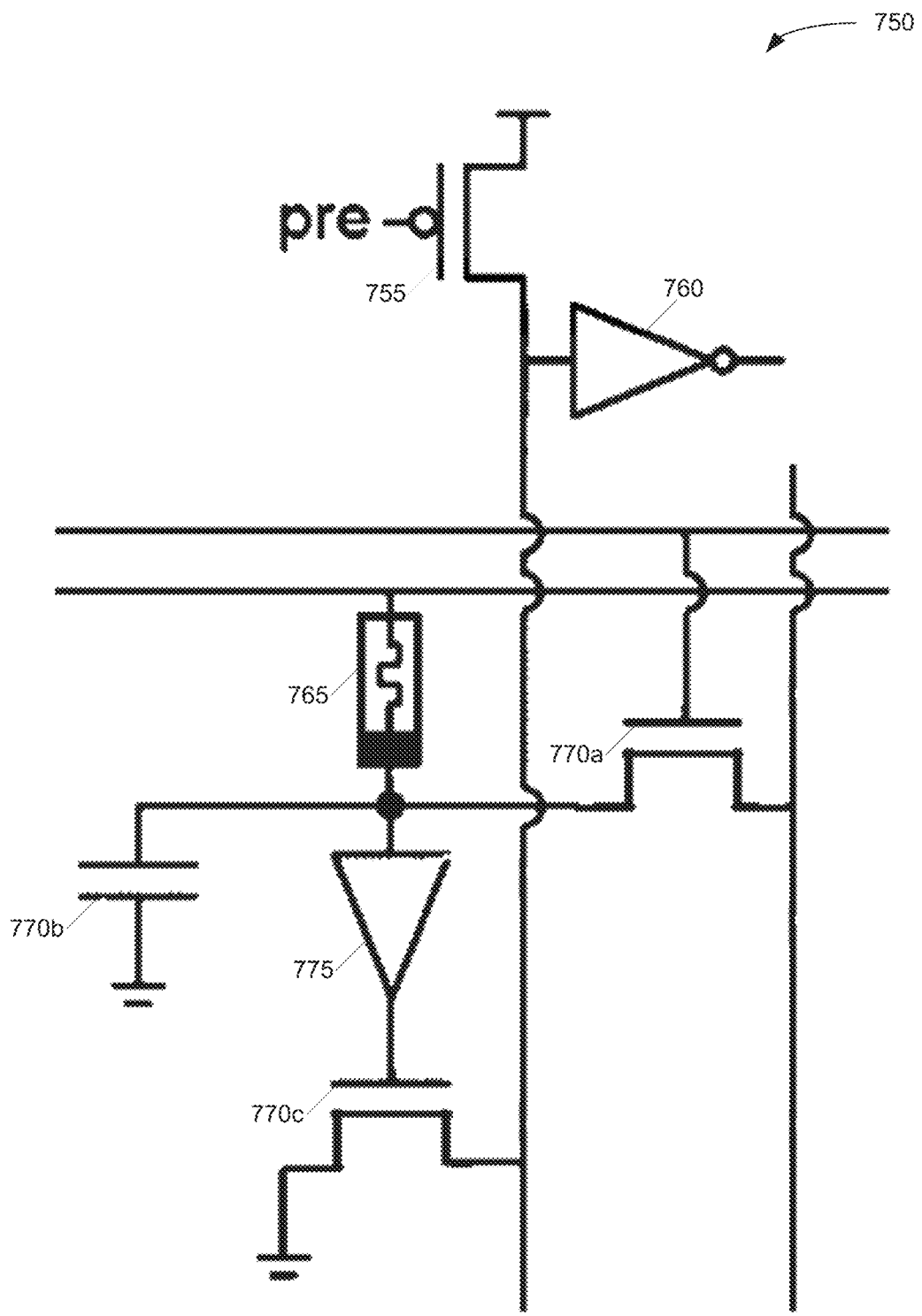
FIG. 7(c) is a conceptual schematic of a race logic circuit for performing tropical algebra functions, with an expanded detail view of a cell of the circuits.

FIG. 7(b) combines multiple elements of FIG. 7(a) and sales up to a 2D array such that it performs tropical vector matrix multiplication, the critical operation for graph traversal, as described in Section 2.3. FIG. 7(c) shows a detailed circuit implementation 750 of the tropical VMM cell. Each cell includes two transistors, one of which is used for programming and the other for operation, as well as a level shifter. In the programming mode, the array is used like a 1T1R array and the memristors are written to the appropriate resistance values. In the operation mode, the programming transistor 770a is turned off, while the gate capacitor 770b is charged through the memristor 765. The level shifter 775 is used to cause the discharge time constant to be determined by the memristor 765 charging process and not the pulldown of the transistor 770c, by applying full swing inputs to the transistor.

In some embodiments, versions of the tunable delay elements described above can be based on memristor or resistive random access memory (ReRAM) technology. CMOS and spintronic versions of such delay elements are also possible, and are discussed in Section 3.1. In the tropical VMM such a device is used as a programmable resistor with a known capacitance to generate an RC delay. The details of these tropical vector algebra cells are shown in FIG. 3(c).

As shown in FIG. 7(c), the circuit designs may comprise cells that contain a 2T1R (two transistor, one resistor) array composed of a pulldown transistor 770c and a programming transistor 770a, as well as a level shifter 775. During the programming phase, the array may be utilized in a sense similar to a 1T1R array, such that the memristors are written to the appropriate resistance values. In other words, the programming transistor coupled with the programming lines can be used to apply the necessary read and write voltages across the memristor 765, thus changing the resistance and therefore RC delay time stored in the device.

In the operation mode, the programming transistor 770a is turned off, while the gate capacitor 770b is charged through the memristor 765. The level shifter 765 is used to make sure that the discharge time constant is determined by the memristor charging process and not the pulldown of the transistor, by applying full swing inputs to the pulldown transistor 770c. That is, during the operation of the circuit, the programming transistor 770a is turned off to decouple the programming lines from the active circuitry. In the pre-charge phase, the output lines are pulled up to $V_{dd}$ through the pullup transistor 755. In the evaluation phase, the input lines receive temporally coded rising edges that charge up the gate capacitors 770b, as shown in FIG. 7. This causes the pulldown transistor 770c to be turned on at the time proportional to input arrival times plus the RC time constant of the coupled memristor-capacitor in each cell, faithfully performing the tropical VMM operation.

In certain embodiments, there may be a limit on the largest read voltage that can applied across the device without disturbing the state of the device. In some experiments, example embodiments showed that maximum read voltage to be approximately 600 mV. In a 180 nm process, this value is only a few 100 mV above the transistor threshold voltage and thus could cause a slow and delayed leak. This leak could allow multiple inputs to affect the pulldown simultaneously, influencing the functional correctness of the circuit. Several solutions to this problem are contemplated herein. FIG. 7(c) shows a level shifter 775 added between the memristor 765 and the pulldown transistor 770c, the full swing of which causes the pulldown transistor 770c to work much faster. In an alternate approach (not shown here), a medium $V_{th}$ device is used for the pulldown. Such devices ensure a small footprint as well as correct operation, provided the fabrication process allows them.

In addition to tropical VMM based linear transformations, other primitive vector operations are crucial in many real applications. Elementwise min and max can be performed with arrays of OR and AND gates, respectively. Vectors can also be reduced to scalars by computing min or max amongst all elements using multi-input OR and AND gates.

Referring now to FIG. 7(a) a circuit diagram 700 is shown which utilizes the cell of FIG. 7(c), in this case to build a circuit that performs the tropical dot product operation. As shown, the circuit comprises and array of delay elements 710a-710d. When presented with an incoming wavefront, the array delays its elements by the values stored in each of the delay elements 710a-710d. Delaying the input wavefront by the values stored in the delay elements performs the elementwise summation operation, which is also the tropical element-wise multiplication by constant operation. The output is then connected to a p-type, metal-oxide semiconductor (PMOS) pre-charge pullup 715a-715d coupled with a NOR-style pulldown network 720 that behaves like a first arrival detector. This performs the MIN operation, which is also the tropical addition operation. Importantly, this circuit 700 performs the indicated function when remaining entirely in the time domain. The input is a time-encoded wavefront, and the output is similarly also a wavefront, though with delay introduced that effectuates (once decoded) the tropical dot product function having been performed on the wavefront.

By way of further explanation, it should be understood that the dot product operation differs from conventional algebra. In conventional algebra, a dot product is a product of the individual vector elements summed over at the end. That is useful for machine learning applications, but not as useful for graph traversal. In contrast, in tropical algebra, the product operation is the (+) operation and the sum operation is the MIN operation. This makes a tropical dot product slightly different. Though it performs a product of elements operation, followed by a summation, in this case it means a (+) operation, followed by a MIN. This MIN, algebra is useful when looking to perform graph traversal operations. These operations benefit from finding the sum over all paths before selecting the minimum one. The sum is performed by the multiplication or product operation while the MIN is the summation or addition operation in this new algebra.

Referring now to FIG. 7(b), another circuit 725 is shown, which performs tropical vector matrix multiplication (a useful operation in graph traversal, as described above). Similar to the conventional matrix multiplication operation, this operation is comprised of multiple tropical dot products being performed simultaneously on input wavefronts. As can be seen, the circuit 725 of FIG. 7(b) comprises multiple elements (730a-730c, 735a-735l, 740a-740l, 740a-740l) of the circuit 700 of FIG. 7(a), connected in a parallel arrangement, with all operating on the same input.

2.5 Embodiments Implementing Non-Linear Tropical Algebra Functions

Figure 8A:
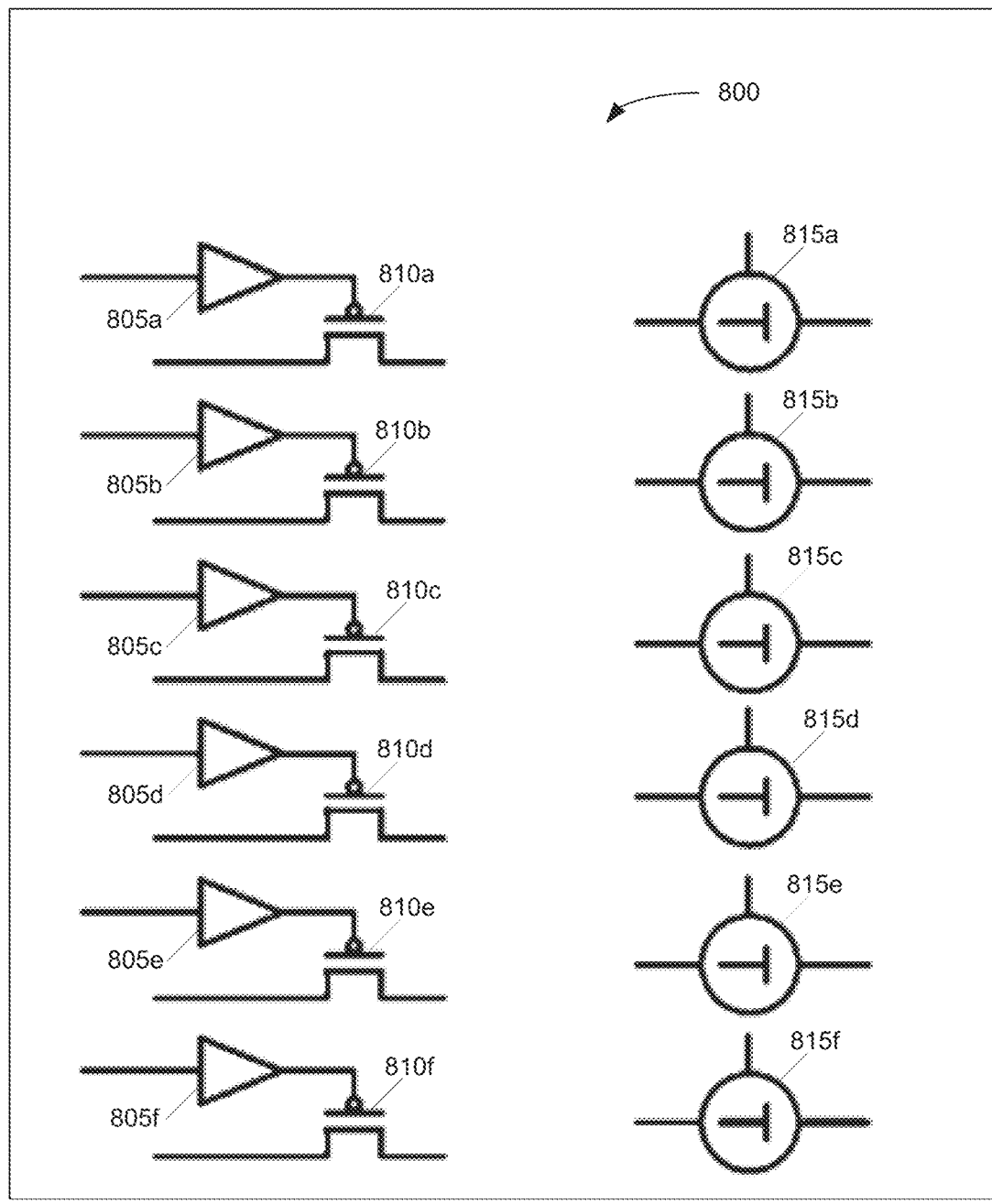
FIG. 8(a) is a conceptual circuit diagram for performing nonlinear race logic functions.

Apart from circuits that allow race logic to implement tropical linear algebra, additional built-in functions, such as elementwise inhibit, argmin, and binarization, are useful to allow for performance of a wider variety of tropical computations. Elementwise inhibit, shown in FIG. 8(a), is particularly powerful, as it allows embodiments contemplated herein to implement piecewise functions. Its technical operation follows directly from the scalar inhibit operation discussed above in the introduction to race logic. As shown, the circuit 800 is configured such that an inhibiting input is buffered before being fed into the gate terminal of a PMOS 810a-810f. As the inhibiting input turns high, the PMOS 810a-810f turns off inhibiting the secondary input.

Figure 8B:
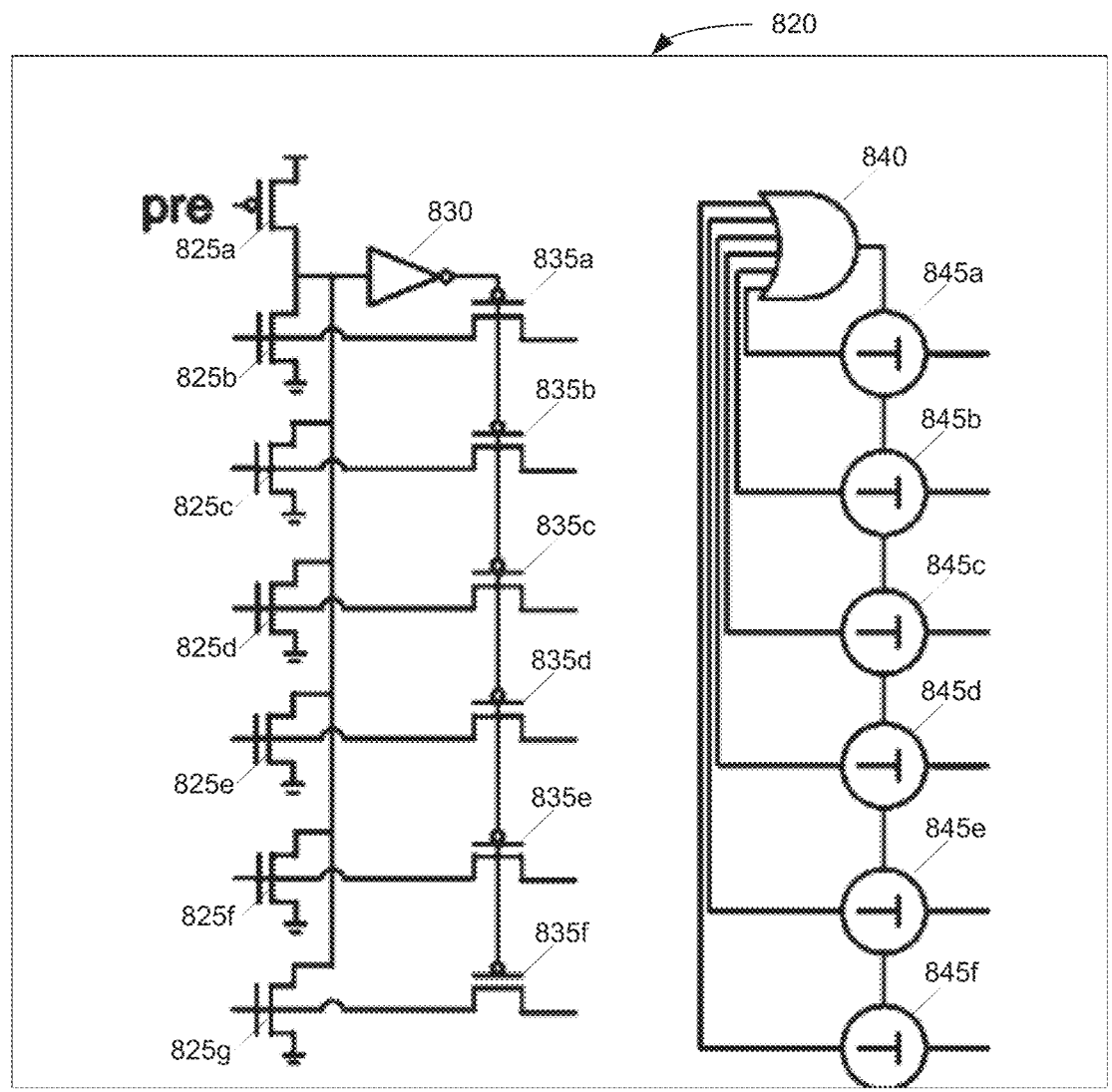
FIG. 8(b) is a conceptual circuit diagram for performing nonlinear race logic functions.

The argmin function, shown in FIG. 8(b), converts its vector input to a tropical one-hot vector that labels a minimal input component. An OR gate 840 is used to select a first arriving signal that then inhibits every vector component. Only one first arriving edge survives its self-inhibition; no other signals in the wavefront are allowed to pass, effectively sending these other values to infinity. The resulting vector is projectively equivalent to a tropical one-hot and achieves the canonical form with a single zero among infinities after normalization.

Figure 8C:
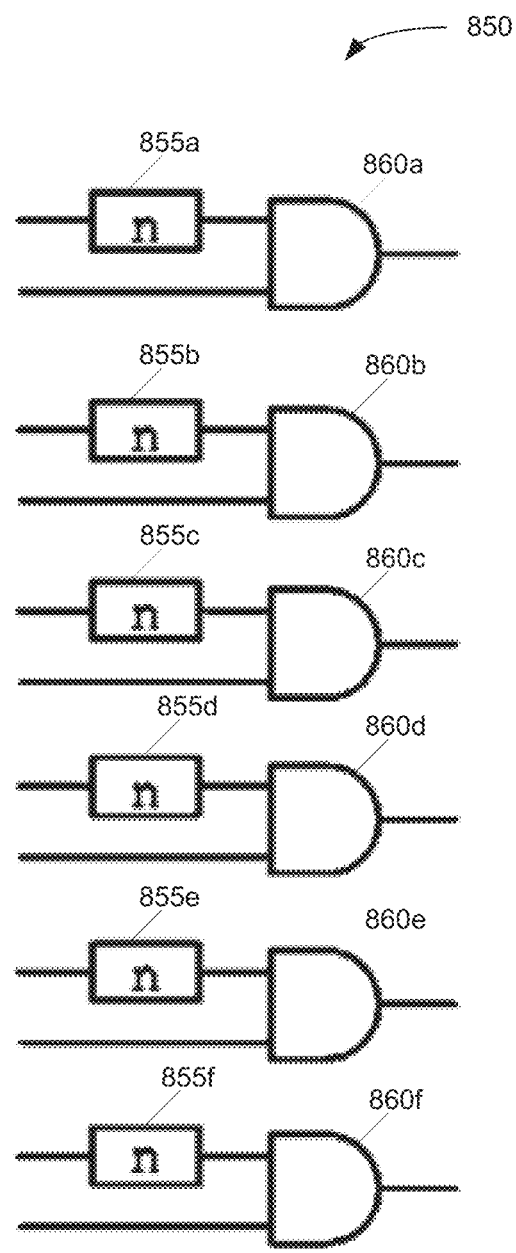
FIG. 8(c) is a conceptual circuit diagram for performing nonlinear race logic functions.

The binarization operation, shown in FIG. 8(c), is similar; it converts all finite components to 0 while preserving infinite components at ∞. This operation utilizes a pre-stored vector that has the maximum finite (non-∞) value $t_{max}$ of the computational dynamic range on each component. binarize $(\vec{x}) = t_{max} \oplus \vec{x}$. Computing the elementwise max of such a vector with any incoming vector, values that are Go remain so while the other values are converted to the maximal finite input value. Normalizing the result via projective storage saves a many-hot vector labeling the finite components of the original input. In other words, the circuit 850 is configured such that in input wavefront is maxed with the all n wavefront. This takes all values to this max value, except Go, which remains as is, thereby performing binarization.

3. Temporal State Machines

The finite state machine or finite state automaton is a central concept in computing and lies at the heart of most modern computing systems. Such a machine is in one of some finite set of states S at any particular instant in time; inputs $x \in \Sigma$ to the machine both produce outputs $y \in \Gamma$ and induce transitions between these internal states. A state transition function $\delta: S \times \Sigma \to S$ determines the next state based on the current state and current input, and an output function $\omega: S \times \Sigma \to \Gamma$ gives the output based on the state and inputs of the machine.

The presence of state means that there is not a one-to-one correspondence between input and output of the machine. In the language developed above, a state machine is an impure function even though $\delta$ and $\omega$ are pure functions. The finite state machine provides a template for composing pure race logic functions across stateful interfaces to create more flexible processing units. The temporal state machines introduced herein fit into this mathematical framework. They differ from conventional automata in that the signals use temporal rather than Boolean encoding. State is made possible by temporal memories (as described above) that use wavefronts as their primary data structure. They freeze temporal data by coupling pulse duration to device properties such as resistance. Together with the pure race logic primitives described in previous sections, temporal memories enable end-to-end temporal encoding in finite state automata.

Designing such a machine requires addressing several issues intrinsic to temporal logic and memory primitives. This disclosure will therefore describe the impure tropical multiplication of two signals in race logic as an example of composing pure race logic across stateful interfaces to break through the invariance restriction. Then, the disclosure will further describe the general state machine formulation and example design considerations for building higher order computational circuits in the time domain.

3.1 Temporal Memories

As described above, the present disclosure has made possible temporal memories that operate natively in the time domain. Some embodiments operate on wavefronts of rising edges rather than on Boolean values. Such memories can be implemented in CMOS and/or with emerging technologies such as memristors (as described above and shown in FIG. 9) and magnetic race tracks. In CMOS, SRAM-based volatile digital storage can be used to select between various delays, controlled either by varying capacitor sizes or the number of inverting stages, Writing into these memories is accomplished by time-to-digital converters or Vernier delay lines. By contrast, the device physics of emerging nanodevice technologies provides a direct coupling between physical time and an analog device property.

Regardless of delay element implementation, memory cells are arranged in an array that may comprise cells or units each having a crossbar. For the read operation of a temporal memory, a read circuit component of a memory applies a single rising edge represented by the tropical one-hot vector to the input address line of the memory, creating a wavefront at the output data line. For a write operation, a write circuit component of the memory causes the column of the crossbar where the memory has to be stored to be activated so that an incoming wavefront is captured and "tunes" the delay element. Various implementations described herein adopt memristor-based memory for concreteness. However, the algorithmic concepts presented in this disclosure are independent of that choice.

The temporal information encoding in the devices varies with technology. For memristors, it is encoded in the RC charging time constants determined by the resistance R of the memristor and the row capacitance C, leading to a linear relationship between timing and resistance. Utilizing a 1T1R-like structure, the shared row capacitances are the output capacitances that have to be charged. In the write operation, the different arrival times of the edges lead to different durations of high voltage across the memristors creating resistance changes proportional to the durations, correctly encoding the shape of an incoming wavefront. This has the advantages of being non-volatile and compact, having analog tunability, and requiring fewer transitions than their CMOS counterparts, hence being potentially more energy-efficient.

Figure 9A:
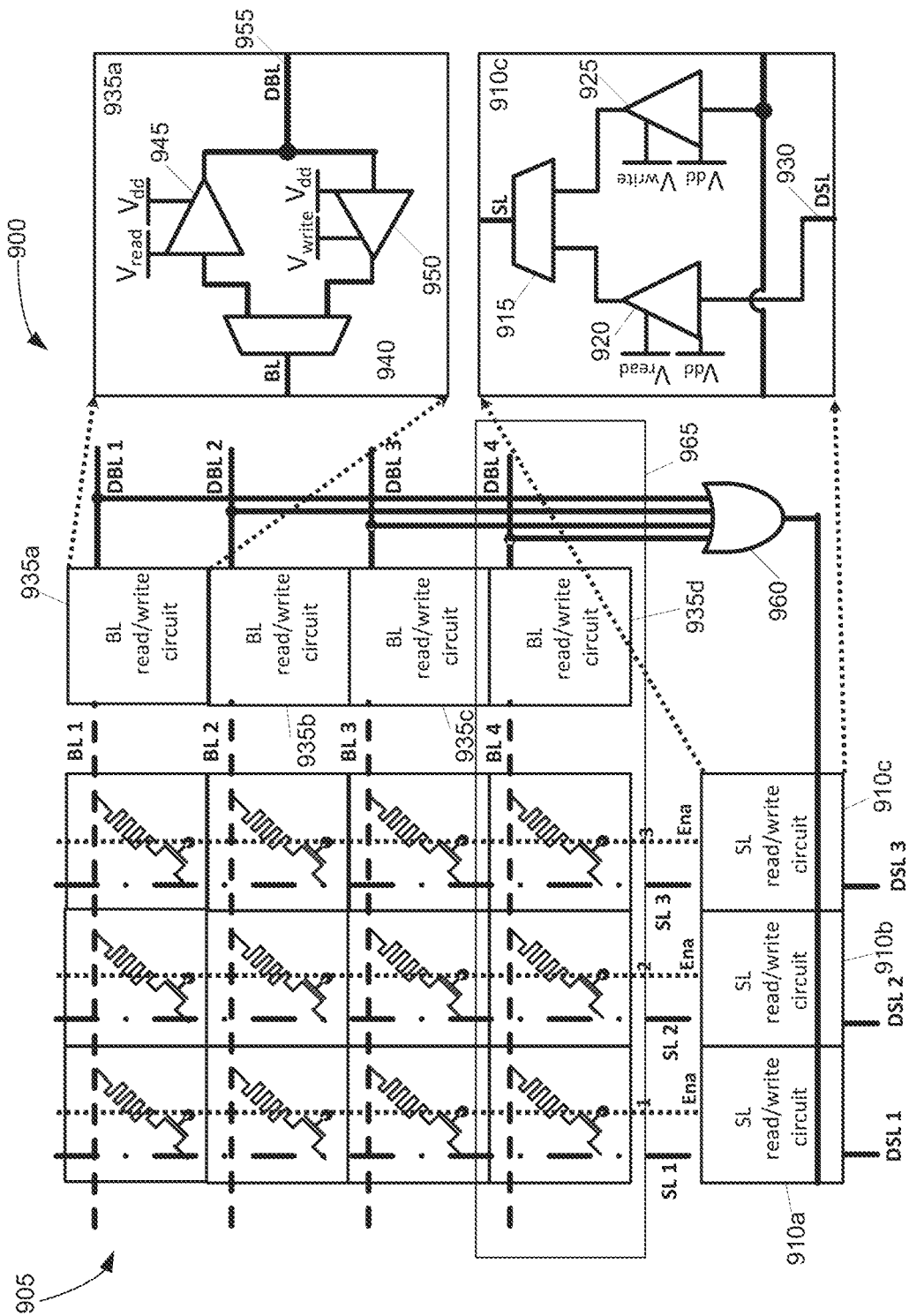
FIG. 9(a) is a conceptual schematic of a temporal memory array, with detailed expanded views of read/write circuit units.

Temporal memories have a disadvantage over conventional memories based on registers. In conventional memories, a single clock tick performs two functions. It captures the next state information from the calculation performed in the previous cycle and initiates the next cycle's computation. Combinational logic is "stitched" together by register interfaces. On the other hand, some embodiments that implement temporal wavefront playback and capture may leverage the same address and data lines for such operations, as shown in FIG. 9(a), and cannot be used at the same time. This feature of temporal memory does not exist in conventional memories, which can be used both upstream and downstream for the same operation.

Temporal memories based on memristors have some disadvantages compared to temporal memories based on CMOS. Because they are analog, they possess limited dynamic range. They also have dead time, as shown in FIG. 5(b), that results from the charging of the parasitics of the array, which—with growing array size—can become comparable to the delays stored. As measured from the temporal origin of the calculation, the dead times introduce artificial delays in each component resulting in incorrectly encoded values at a memory write input. To deal with this issue, the embodiment shown introduces an extra line, which is called the clock line, that always has the minimum $R_{on}$ value for the resistor. This line serves as a temporal reference to the origin and hence behaves like a clock. This ensures that the parasitics of the lines are accounted for and only the relative changes in the resistance values are translated to the output wavefront. Such a reference also plays an important role in normalization. It should be noted, however, that while the computing scheme discussed herein can be either analog or digital, certain evaluations (e.g., Section 5 below) were performed assuming analog behavior, noise, and other non-idealities which determine the practical information capacity.

The dynamic range/precision of memories discussed is determined by the changes in the stored resistances that can be distinguished. In some embodiments using available technologies, experiments showed that a workable range is six to seven bits with present technologies. Given this constraint, some designers may prefer to focus on storage of normalized tropical vectors. In Section 2.2, the disclosure describe how normalization consists of subtracting from each component the minimal value of all components. Operationally, this is performed by grounding the clock line of the vector storage circuit in FIG. 9. The clock line is used to indicate the t=0 time, but in its absence t=0 is established by the first arriving edge. Grounding the clock line effectively subtracts the value of the first-arriving edge from the entire vector, giving the normalization operation described in Section 2.2. The algorithms explored in Section 4, are specifically designed to be insensitive to this origin shift. Algorithms can also store the normalization constant for later re-construction of the unnormalized wavefront.

Referring now to FIG. 9(a), a 4×4 memristive temporal memory 905 is shown. As noted above, a memristive array is one of several methods that could be employed to provide for temporal memory capability in designing temporal computational circuits in accordance with the present disclosure. As shown, the memory array 905 contains read and write peripheral circuits (910a-910c, 935a-935d) as described above. However, note that bit-line 4 has been replaced by a dummy line 965 where the resistance values are fixed. The bit line is now labeled as a "Clock Line"; the time constant of this line is governed by the parasitics of the circuit 900 and determines the temporal origin of the outgoing wavefront. In other words, delay introduced by other cells in the array 905 will be measured against the non-delayed output of this Clock Line. It is to be understood, however, that other techniques may be employed for providing a baseline pulse against which the delayed outputs of a temporal memory can be compared. In operation, the temporary memory performs write operations by programming delay into the array 905 of memristors (other than in the Clock Line) by applying a voltage differential across the memristors for varying amounts of time according to the data to be encoded in the memory. The temporal memory then performs read operations by outputting a pulse that is time delayed at each output line according to the amount of resistance programmed into the associated memristors.

Figure 9B:
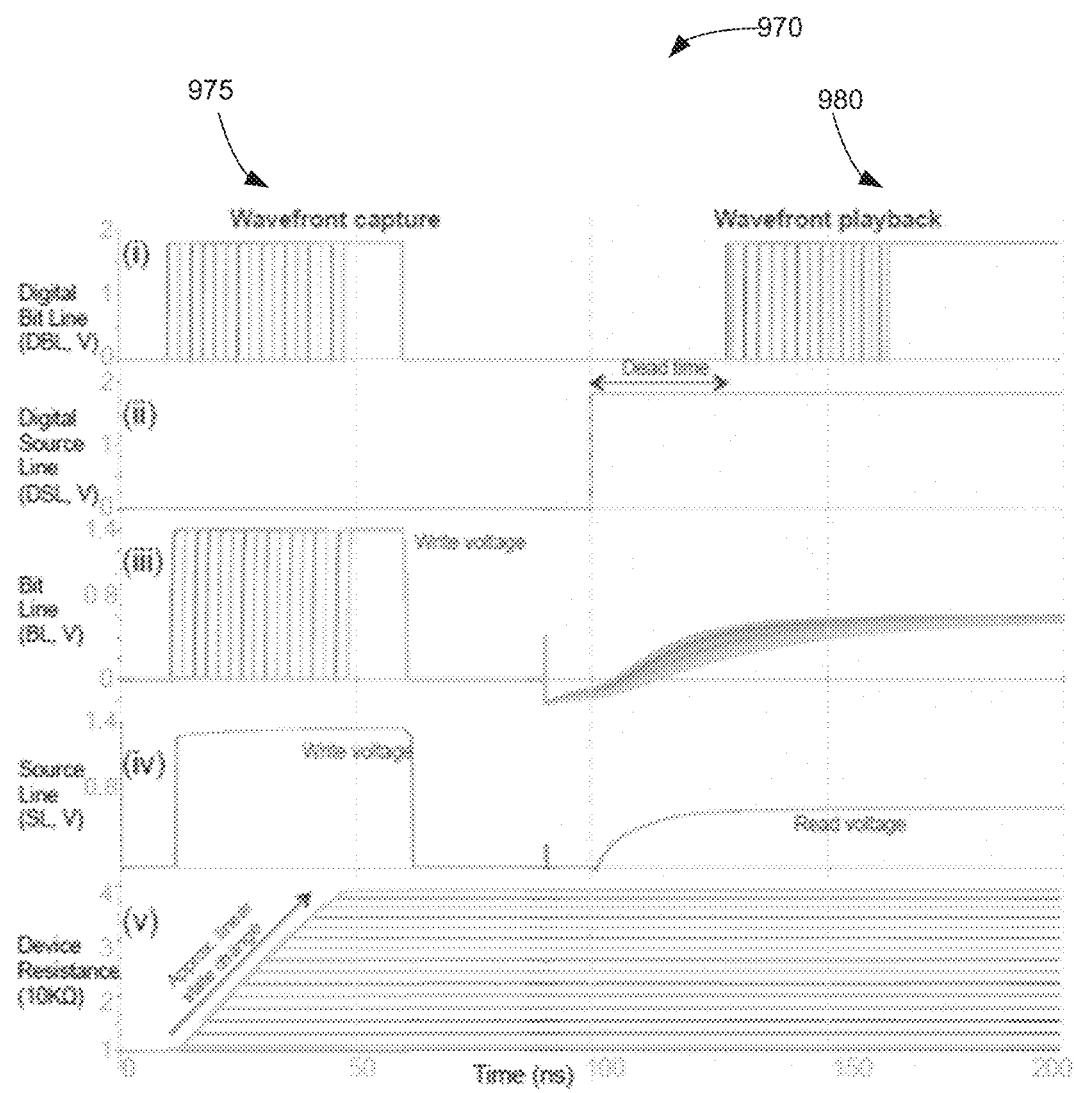
FIG. 9(b) is a set of graphs showing example operations performed via a temporal memory array.

FIG. 9(b) shows the functioning of a 16×16, 4-bit, temporal memory as simulated in a 180 nm process. Graph (i) shows the capture and playback of a linearly varying digital wavefront, with each color representing one of the 16 lines involved. These edges have been collapsed into a single strip for clarity. Note that small timing mismatches cause small changes in the shape of the wavefront that is played back. Graph (ii) shows in the digital read input applied to a captured column. Graphs (iii, iv) show the source lines and bit lines internal to the memory. These lines operate at different voltages that are shifted to Vdd with level shifters, as shown in FIG. 9(a). Graph (v) shows the almost linear state change of the memristors as given by the memristor model described above. Careful inspection reveals a slight convexity due to higher order terms in the exponential dependence.

3.2 Invariance and Temporal Addition; A Sample Temporal State Machine

With temporal memory, tropical multiplication of two wavefronts breaks the operation into two phases, as shown in FIG. 10. FIG. 10 is a conceptual diagram 1000, 1020, 1040, 1060 of a temporal computational circuit that shows representations of how the circuit operates as it steps through a tropical multiplication operation. Each panel of FIG. 10 shows a step, or increment, in performing the computation using stateful race logic. Each phase is implemented serially on the state machine in FIG. 10. Breaking the computation into discrete read-compute-store transitions of a state machine allows us to represent the computation with a procedural algorithm, Algorithm 1. All operations, aside from the first phase of the tropical multiplication, store an output back in the temporal memory. The element-wise operations are two-argument operations and involve all three memories: The read memories are the upstream memories, while the write memory is the downstream memory.

Figure 10A:
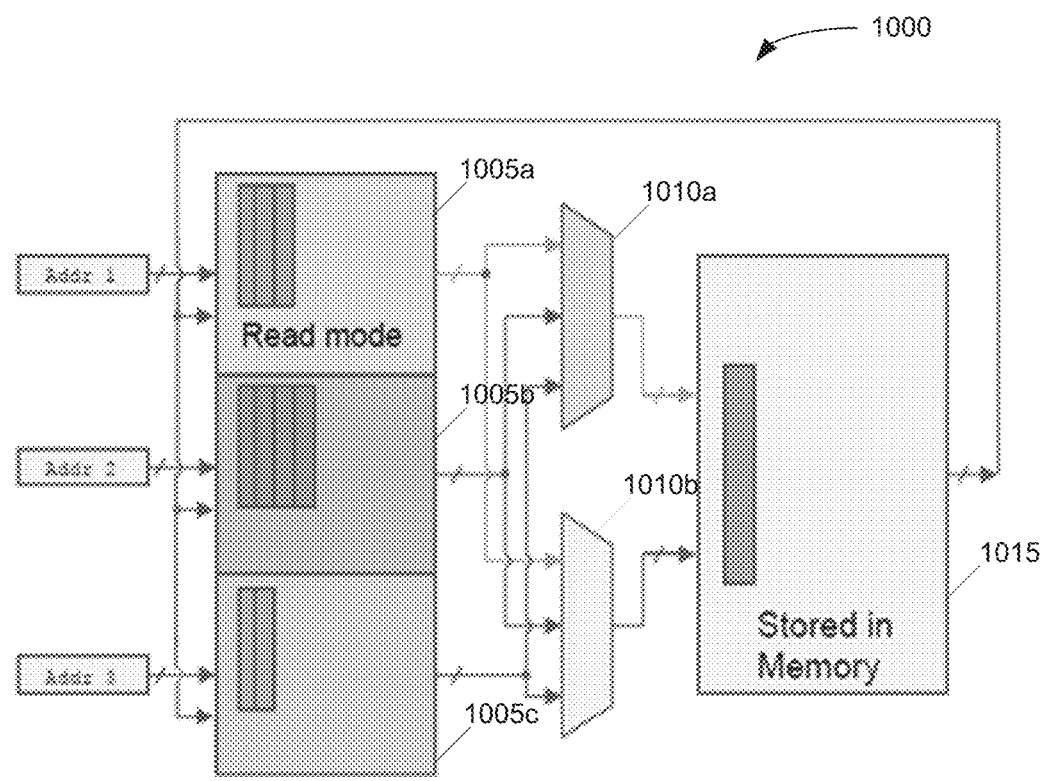
FIG. 10(a) is an organizational circuit diagram showing interrelationship of various memory and computational components in a temporal state machine example.

Referring now to FIG. 10(a), a conceptual diagram 1000 of a circuit for performing tropical multiplication using temporal computational components arranged as a state machine is shown. As shown, the state machine is partitioned into two main units: the temporal wavefront memory and the arithmetic unit. The memory unit comprises three banks of temporal memory 1005a-1005c (such as memory units designed per the disclosure above), which can receive address inputs from external sources as well as data inputs from the output of the circuit which are redirected back to the memory unit. It should be understood that this breakdown of components into memory and computation/operation will serve as a basis for designing multiple times of computational circuits, not merely the state machine for tropical multiplication shown. In FIG. 10, multiplexers 1010a-1010b disposed between the memory 1015 and arithmetic unit coordinate the read/write modes of the memory allow operations to be performed sequentially. The date outputs of the wavefront memory are multiplexed into the computation unit. Thus, depending on the operations being implemented by the circuit, individual memory units 1005a-1005c can behave as either upstream or downstream memories. Storage of the incoming wavefront is a one-argument operation; the vector is stored in the additive memory bank. The computation unit may comprise invariant race logic functions, per the discussion above, as well as a temporal memory unit for tropical VMM. This structure allows for two-operand operations to be executed at once, though it should be understood that other configurations may allow for execution of different types of operations.

Figure 10B:
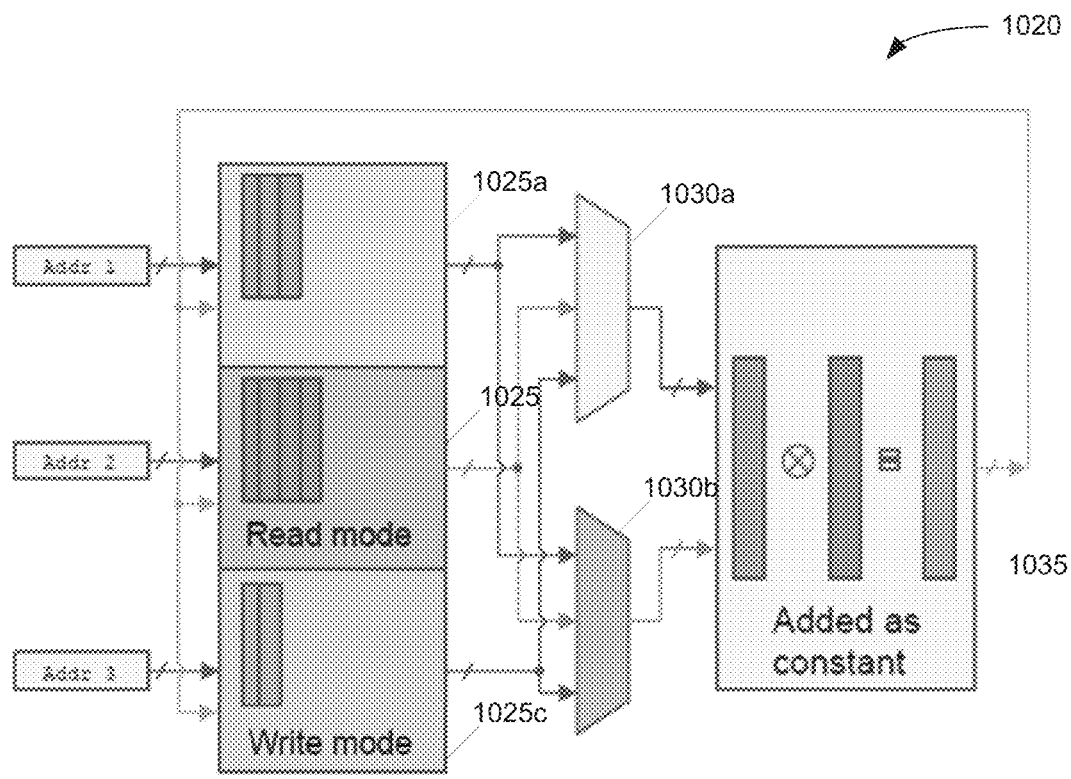
FIG. 10(b) is an organizational circuit diagram showing interrelationship of various memory and computational components in a temporal state machine example.

FIG. 10(b) shows the second phase of tropical multiplication using this circuit. In this phase, the previously-stored vector is temporally "added" to a second, incoming wavefront. In other words, the incoming wavefront is delayed component-wise (i.e., tropically multiplies) by the stored wavefront. It is to be understood, however, that commutativity ensures that the order of storage and playback does not matter. In other words, the second wavefront could be delayed by the first, stored wavefront, or vice versa. Though the state transition and output functions within each phase are pure race logic functions, state breaks invariance across the phase boundaries. Using memory for tropical multiplication allows the construction of tropical multinomial functions of arbitrary order.

Figure 10C:
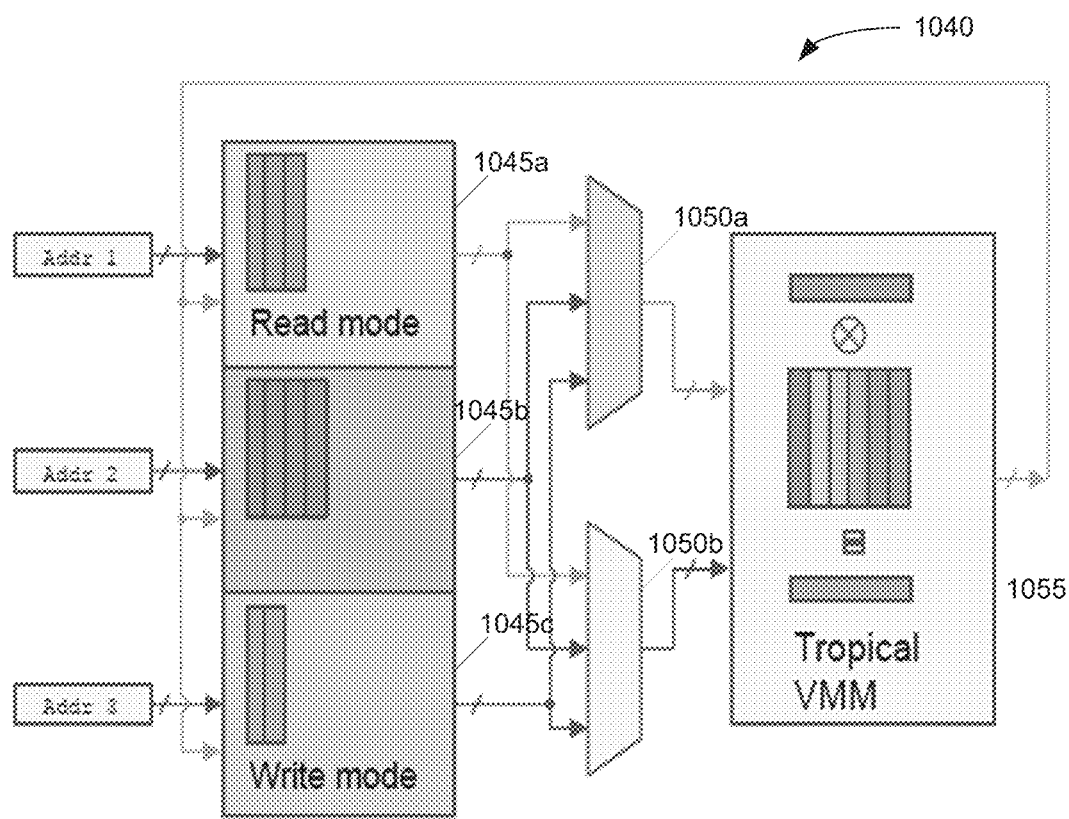
FIG. 10(c) is an organizational circuit diagram showing interrelationship of various memory and computational components in a temporal state machine example.
Figure 10D:
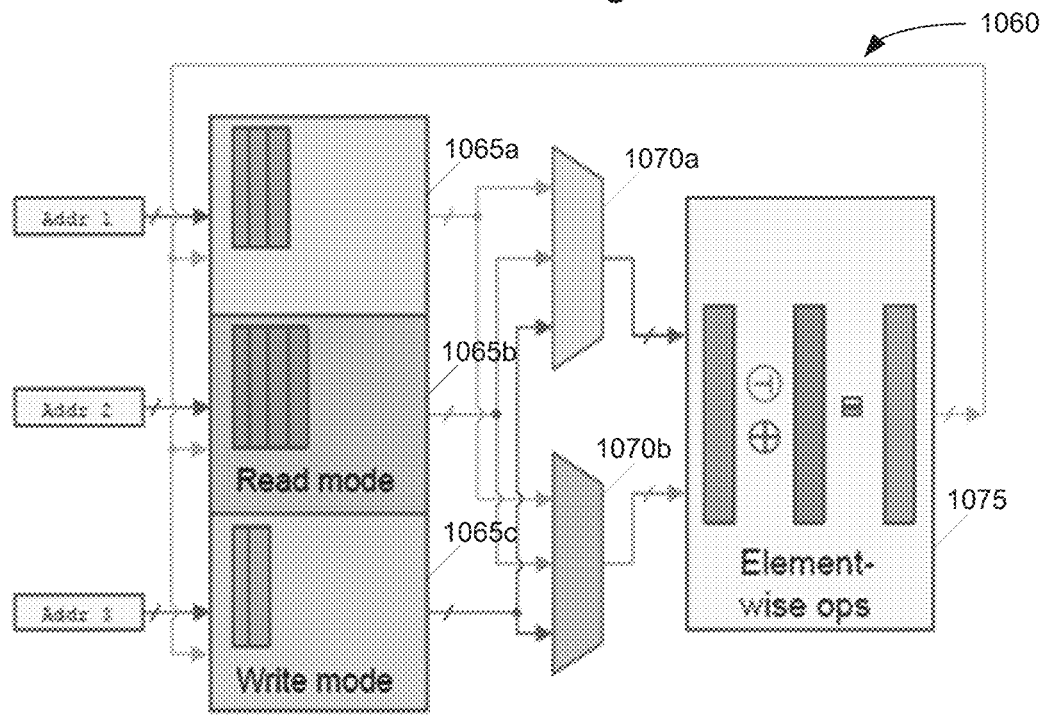
FIG. 10(d) is an organizational circuit diagram showing interrelationship of various memory and computational components in a temporal state machine example.

FIG. 10(c) shows the tropical vector matrix multiplication function being performed in the computational unit. FIG. 10(d) illustrates that other element-wise operations can be performed in a temporal state machine. All operations, aside from the first phase of the tropical multiplication, store an output back in the temporal memory. Thus, the element-wise operations are two-argument operations and involve all three memories: the read memories are the upstream memories, while the write memory is the downstream memory.

Therefore, the computational circuit in FIG. 10 can be thought of as accomplishing the function of Algorithm 1:

---

ALGORITHM 1: Pseudocode for procedural computation of Equation (3)

Input: temporal vectors $\vec{b}$, $\vec{c}$, $\vec{d}$ and $\vec{e}$
$\vec{c}' := \vec{d} \otimes \vec{e}$ ;   // temporal vector addition (requires two phases). FIGS. 6(a,b)
$\vec{b}' := \vec{c} \dashv \vec{c}'$ ;   // elementwise inhibit, FIG. 6(d)
$\vec{a} := \vec{b} \oplus \vec{b}'$;   // elementwise min, FIG. 6(d)
return $\vec{a}$;

---

The state machine partitions calculations into phases to calculate arbitrary expressions, such as:

$$\vec{a} = \vec{b} \oplus \left(\vec{c} \dashv \left(\vec{d} \otimes \vec{e}\right)\right). \tag{3}$$

Using the regular order of arithmetic, the circuit performs tropical multiplication first. Vectors $\vec{d}$ and $\vec{e}$ reside in memories one and two. The operation is shown in FIG. 10(a, b). The first phase initiates the computation by selecting the memory in the computation unit and applying a one-hot vector at the input of wavefront memory 1. The memory places the vector $\vec{d}$ on the output data bus, which then passes it to the accumulator of the computation unit. Then, memory 3 is set up to receive the output of the operation while being activated in write mode, shown in FIG. 10(b). A one-hot vector is applied to the input of memory 2, playing the wavefront through the stored vector, and storing the resulting output in memory 3. This storage operation is indicated by the assignment operator := in the pseudocode of Algorithm 1 above. Tropical vector-matrix multiplication is a similar one-input operation and can be performed in a similar way, as shown in FIG. 10(c).

Both one- and two-operand operations can be performed in a single state machine. Two-operand operations, such as elementwise inhibit and tropical vector addition, proceed similarly to one-operand operations. Synchronized one-hot vectors are presented to the address input that triggers output wavefronts. These wavefronts enter the computational unit where circuits for the requested operations are multiplexed in, and the output is written to wavefront memory 3, as shown in FIG. 10(d).

Therefore, it should be recognized that the concepts and general arrangement of a state machine per the above discussion and the content of FIG. 10 present examples for how state machines can be created to accomplish low-level arithmetic operations. These operations can be combined in various ways to generate higher-order computational units or ALUs, as part of a more complex or general-purpose computational environment. A few examples of such applications will be described below:

3.4 DNA Alignment

DNA alignment using a Needleman-Wunsch algorithm can be performed using race logic. Using the principles and concepts described herein this function can be performed without the need for a dedicated ASIC. Instead, a more general-purpose temporal state machine per the present disclosure can be used.

The Needleman-Wunsch algorithm finds the shortest path through a dynamically constructed score matrix. Each element of the score matrix $M_{ij}$ is constructed recursively as $M_{ij}=\min M_{i,j-1}+\sigma, M_{i-1,j}+\sigma, M_{i-1,j-1}+m(1\delta x_i, y_i)$, where $\sigma$ is the cost of a genetic insertion or deletion (an "indel") and m is the cost of a single gene mutation. The Kronecker delta function breaks the causality condition and so cannot be implemented in pure race logic. (The Kronecker delta $\delta_{ij}$ is defined as one when i=j and zero otherwise.)

To compute the Kronecker delta using stateful race logic, as described herein, the set of four possible genes {G, A, T, C} are encoded as temporal values {0, 1, 2, 3}. The coincidence function can then be used to determine equality of the temporally encoded gene values. Tropically, the coincidence function is described as $\delta(t_1, t_2)=(t_1 \oplus t_2)(t_1 \oplus' t_2)$, which is equal to the inputs when they are the same, and otherwise. The coincidence function could be made a primitive operation of the state machine or could be accomplished with multiple state transitions using, $\oplus$, $\oplus'$, and ¬; the former is assumed for present purposes. Binarization followed by projective storage of $\delta(x_i, y_i)$ would save zero (tropical one) to memory when $x_i=y_i$ and (tropical zero) otherwise, resulting in a many-hot vector that indexes genewise equality. (The simplified version presented herein may apply to only an idealized coincidence: the exact point where $t_1=t_2$. In practice, a nonzero coincidence window can be introduced via a tolerance $\epsilon$, by computing $[\epsilon \otimes (t_1 \oplus t_2)]¬(t_1 \oplus' t_2)$.

To frame the Needleman-Wunch algorithm as a tropical vector problem, we exploit the independence of the skew-diagonals. We define $J\mu^{(k)}$ as the kth skew-diagonal vector of M, so $J\mu^{(0)}=[M_{00}]$, $J\mu^{(1)}=[M_{10}, M_{01}]$, and so on. The first and last elements of $J\mu^{(k)}$ are $k\sigma$ by construction for k n, that is, until we hit the main skew diagonal. The defining equation for $M_{ij}$ is then given through $J\mu^{(k)}$ by:

$$\mu_j^{(k)} = \left(\sigma \otimes \mu_j^{(k-1)}\right) \oplus \left(\left[m \oplus \delta_{x_j, y_{k-j}}\right] \otimes \mu_j^{(k-2)}\right) \oplus \left(\sigma \otimes \mu_{j+1}^{(k-1)}\right). \quad (4)$$

The vectorized computation of this recursion relation is presented programmatically in Algorithm 2. The right-hand side of each assignment is a pure race logic computation; the left-hand side represents a register address. As in Algorithm 1, the assignment operator $\vec{x} := \vec{y}$ indicates storage of $\vec{y}$ to a temporal memory register represented by $\vec{x}$. The projective storage operator $\vec{x} :\cong \vec{y}$ assigns the tropical normalization $\vec{y}$ min $\vec{y}$ to the vector register $\vec{x}$.

The interpreter required here is more complex than in Algorithm 1. In some embodiments, "for" loops could be implemented tropically by assigning k:=1⊗k and monitoring n¬k and 2n¬k. In this configuration, k, as well as the array slicing operations, would be managed digitally by the interpreter. In some embodiments, the interpreter may be a compiler or other higher-order software which will be implemented in the Boolean domain, and then used to order the computations in the temporal domain.

4. Dijkstra's Algorithm Implemented in a Temporal State Machine

As another example, the present disclosure will now demonstrate how the building blocks and concepts described above could be utilized to implement Dijkstra's Algorithm in a temporal state machine.

In Section 3, above, a simple model state machine was described, though the design was not complex enough to utilize the graph traversal logic of tropical linear algebra that was described in Section 2.3. Though the Needleman-Wunsch machine in Section 3.4 performs graph traversal, it is designed for a known, uniform progression through a highly regular planar graph. From the discussion of Section 2.3, it has been shown that general graph traversal should be accessible to a tropical state machine. Here, the present disclosure provides an implementation of Dijkstra's algorithm in a temporal state machine. The core neighbor-search operation of Dijkstra's algorithm is naturally parallelized by the tropical VMM, leading to very high throughput in terms of graph edges traversed per unit time, and that the inhibit operation together with projective storage allow the embedding of important Boolean logic structures within the temporal framework.

Below, the operations of Dijkstra's algorithm are mapped into race logic, with each step a single transition of a temporal state machine. Two modifications simplify the race logic implementation. First, instead of tracking the known distances to each node, we mask out the distances of visited nodes with the value. This vector of distances to unvisited nodes is $\vec{d}$ in the algorithm listing, and a tropically binarized record of which nodes have been visited is recorded in a vector $\vec{v}$. Second, instead of storing a parent vector directly, a parent matrix $\vec{P}$ can be defined as a collection of tropical column vectors where a finite entry $P_{ij}$ holds the distance

---

ALGORITHM 2: Pseudocode for Needlemean-Wunsch
(forward-pass only; computes optimal alignment cost)

---

Input: gene sequences $\vec{x}, \vec{y} \in \{0, 1, 2, 3\}^n$, indel cost $\sigma$, mismatch cost m
$\vec{\mu}^{(0)} := [0]$;
$\vec{\mu}^{(1)} := [\sigma, \sigma]$;
// Upper-left triangular part [dim($\vec{\mu}^{(k)}$) increasing]:
for k ← 2 to n do
  | $\vec{c}' := \delta(\vec{x}_{1, \ldots, k-1}, \vec{y}_{k-1, \ldots, 1})$;    // mismatches → ∞, matches → {0, 1, 2, 3}
  | $\vec{c} :\cong \text{binarize}(\vec{c}')$;    // mismatches ⤳ ∞, matches ⤳ 0
  | $\vec{a} := \sigma \otimes \vec{\mu}^{(k-1)}$;    // apply insertion/deletion (indel) cost $\sigma$
  | $\vec{b} := (m \oplus \vec{c}) \otimes \vec{\mu}^{(k-2)}$;    // apply mutation cost m for mismatches
  | $\vec{r} := \vec{a}_{0, \ldots, k-2} \oplus \vec{b} \oplus \vec{a}_{1, \ldots, k-1}$;    // find least-cost local path (Equation (4))
  | $\mu^{(k)} := [a_0, \vec{r}, a_{k-1}]$;    // append boundary conditions
end
// Lower-right triangular part [dim($\mu^{(k)}$) decreasing]:
for k ← n + 1 to 2n do
  | $\vec{c}' := \delta(\vec{x}_{k-n, \ldots, n}, \vec{y}_{n, \ldots, k-n})$;    // mismatches → ∞, matches → {0, 1, 2, 3}
  | $\vec{c} :\cong \text{binarize}(\vec{c}')$;    // mismatches ⤳ ∞, matches ⤳ ∞
  | $\vec{a} := \sigma \otimes \vec{\mu}^{(k-1)}$;    // apply insertion/deletions (indel) cost $\sigma$
  | $\vec{b} := (m \oplus \vec{c}) \otimes \vec{\mu}^{(k-2)}$;    // apply mutation cost m for mismatches
  | $\vec{\mu}^{(k)} := \vec{a}_{0, \ldots, 2n-k} \oplus \vec{b} \oplus \vec{a}_{1, \ldots, 2n-k+1}$;    // find least-cost local path (Equation (4))
end return $\vec{\mu}^{(2n)}$; // this is actually just a scalar: lowest possible alignment cost from node i to node j along the current optimal path to j from the source node s. In the present embodiment, the memristors in the VMM are already programmed to their correct values, meaning that the graph is already stored in the arithmetic unit.

There are several apparent differences in how operations of the algorithm are performed in this (tropical) linear algebra engine compared to a traditional programming language. There are, loosely speaking, two "modes" in which tropical vectors can be used. First, there are true temporal wavefronts, such as $\vec{e}$ and $\vec{d}$ that represent variable distances measured throughout the graph. These flow through the data path of the algorithm. Second, there are indicator wavefronts, such as $\vec{v}$ and $\vec{d}^{**}$, with elements restricted to 0 or ∞. These are used along the control paths of the algorithm to perform element lookup from data-carrying temporal wavefronts, modification of tropically binary records such as $\vec{v}$, and for index selection of the parent matrix. Projective storage also impacts these processes via binarization of one-hot vectors. Sometimes, quantities like $\vec{n}$ can play either role depending on context.

There are two additional considerations to take into account in this algorithm's application, which are also illustrative of how other operations (beyond this algorithm) might be implemented using stateful race logic. First, because directed edge weights are encoded as temporal delays, negative edge weights are physically forbidden. Second, temporal vectors are limited to a finite dynamic range and resolution constrained by the technology in which they are implemented, and consecutive tropical multiplication could lead to dynamic range issues. To mitigate this dynamic range issue, we arrange the computation such that no more than one successive tropical multiplication occurs along a single datapath per state machine transition. Normalization of $\vec{u}$ at the end of each cycle shrinks the dynamic range as much as possible between VMMs.

The algorithm initializes by setting the vector $\vec{d}$ of known distances to unvisited nodes to a tropical one-hot $0_s$ labeling the source node s. The vector $\vec{v}$ labeling visited nodes, as well as the parent matrix $\hat{P}$ keeping track of the minimal spanning tree through the graph, have all elements set to ∞. We assume the weighted adjacency matrix $\hat{A}$ of the desired graph has been programmed to a VMM unit before the algorithm begins. This is a one-time cost that can be amortized over frequent reuse of the array. The algorithm then begins by cycling the state machine through the main loop.

In each iteration, we check to see if any unvisited nodes are available for exploration by evaluating the minimum element of $\vec{d}$. The algorithm terminates if this operation returns ∞, which indicates that all nodes have either been visited or are unreachable. Taking the argmin (Section 2.5) of $\vec{d}$ nominally gives us a vector $d_j \otimes 0_j$, where j is the index of a node along a shortest path (of those so far explored) from the source and $0_j$ is the tropical one-hot labeling index j. This result is a one-hot vector, because $d_j$ is always zero by construction. We store this one-hot to the vector register $\vec{n}$.

The next step is to examine the directed edges to the neighbors of node $\vec{n}$. We use $\vec{n}$ as the input to a temporal VMM operation with $\hat{A}$, which performs a parallel traversal to all neighbors. The result is stored in $\vec{e}$, which may contain shorter paths to the neighboring nodes, via node $\vec{n}$, than had been previously found. Such shorter paths would manifest as elements of $\vec{e}$ that have smaller values than their corresponding elements in $\vec{d}$. Those specific nodes can be extracted by taking an elementwise inhibit of $\vec{e}$ by $\vec{d}$; the resulting updated distance vector is stored as $\vec{d}'±$. We also note that $\vec{n}$ has been visited, and should not be visited again, by imposing the zero of $\vec{n}$ onto $\vec{v}$ and saving it in memory.

If the dynamic range of our memory were boundless, then we could perform this operation repeatedly and determine the final distance vector of the algorithm. But because we are dynamic-range-limited we have to minimize the accumulation in the distance vector. We do this via projective storage of $\vec{d}'$ into $\vec{d}$. We also inhibit $\vec{d}'$ by $\vec{v}$ before storage to ensure that no nodes we have already visited are candidates for exploration in the next iteration; this also ensures argmin($\vec{d}$) will be a magnitude-free one-hot on the next cycle. This shifts the temporal origin for the entirety of the next iteration into the perspective of argmin($\vec{v}\dashv\vec{d}'$); all temporal values in the new $\vec{d}$ are now expressed relative to the stopwatch of an observer at the argmin node.

After exploring neighbors, we update the parent matrix. The newly found nodes in $\vec{f}$ need to have their parents updated. A binarized version $\vec{f}^*$ of $\vec{f}$ is used to inhibit rows of the parent matrix corresponding to the new paths in f, erasing these nodes' now-outdated parent data. This operation is performed row-by-row, requiring N state machine transitions to complete. The new parent is then added to the parent matrix; $\vec{n}$ is used to enable the appropriate column of $\hat{P}$ for writing. Vector $\vec{f}$ is then written to this column.

Throughout this algorithm, we require dynamical indexing of memory addresses based on past results of the temporal computation. Recall that Needlemen-Wunsch algorithm required significantly nontrivial subarray selection operations in Algorithm 2. We claimed in Section 3.4 that these would likely need to be handled digitally. Those index selections can be statically deter-mined at compile time, so they could merely be part of the elaborated bytecode controlling the state machine: There is no need for data to translate back and forth between temporal and digital domains to execute Algorithm 2. In Algorithm 3, index selections of the parent matrix are dynamically determined at runtime and cannot be statically embedded in the digital controller around the state machine. But the one-hot nature of the indexing operations offers a natural interface to the crossbar architecture, so, again no digital intermediary is required to perform address lookup.

Other Examples of Temporal State Machine Circuits

Given the examples and design considerations set forth above, it should be understood that the present disclosure is not limited to temporal computational circuits that carry out only the specific operations and algorithms set forth above. Just as there are many types of computational circuits for Boolean/digital domain (e.g., processors, controllers, OpAmps, and other function-specific chips/components), there can also be many types of computational circuits implemented in the time domain using the race logic and tropical algebraic concepts disclosed herein. For Boolean/digital electronics, the various gates that are commonly known (AND, OR, NAND, NOR, XOR, etc.) and implemented via transistors, are organized in various known ways to implement higher order components (e.g., ALUs, etc.).

Here, the tropical algebraic operations described above (min, max, increment, inhibit, etc.) can be assembled to perform various types of higher-order functions (e.g., vector matrix multiplication, etc.). In the examples given above, these higher order, higher complexity circuits perform a variety of useful functions. These functions may find application in a variety of pursuits. For example, state machines functioning via tropical algebraic time domain computations per the present disclosure could be useful for path planning and navigation applications, routing and logistics operations, and other graph search and shortest path applications beyond simply maps, such as social media graphs, network graphs, social connectedness, etc. Such applications, and others that might involve many primitive graph operations can easily be performed using hardware and methods according to this disclosure.

Experiments and Analysis of Applications

The inventors performed several simulations, analyses, and experiments to test and validate example embodiments. In these tests, several assumptions were made to evaluate the design and the simulation framework of a temporal state machine. Models were made for temporal memories and the tropical operations required by its design to understand the scaling of the architecture and the tradeoffs of design space and to assess optimization targets.

In one simulation, to achieve realistic first-order performance estimates for a temporal state machine, each component was designed and simulated using commercial "very-large-scale integrated circuit" (VLSI) design tools, such as Cadence Virtuoso for schematic and Spectre for simulation, with experimentally validated nanodevice models. These devices exhibit voltage and current ranges typical of other memristors fabricated by a variety of groups. Though the voltage needed to read these devices can be low (200 mV), the voltages needed to write them can be as high as 2V to 3V, which puts a lower limit on the technology node that can be used. To secure enough voltage headroom for changing device states, a 180 nm Silterra process with a $V_{dd}$=1.8V were used. Though this may not offer the most energy-efficient results, it does provide an understanding of the general set of tradeoffs involved in building realistic temporal state machines.

In the inventors' experiments, the temporal memory was memristive. The core cell was composed of a 1T1R structure with supporting circuits that allow temporal read and write operations. The temporal read operation is performed by down-shifting the input voltage level from 1.8 V to 600 mV before applying it to the 1T1R array, so the device state is unaffected. This causes the output voltage to have a maximum value of 600 mV, which needs to be up-shifted to 1.8 V for compatibility with other functional blocks, all of which work at $V_{dd}$. The write path of the memory includes circuits for two different write modes, the conventional and normalized forms described previously. Both of these operations can involve similar circuits with an input first-arrival detector charging the source line and level shifting circuits to the appropriate write voltages, producing a quasilinear state write.

Read and write energy costs were computed for various N×N array sizes ranging from N=4 to N=32. The energy scales super-linearly with array size due to growth in support circuitry that scales with N, the input driver benefits from being scaled up for larger array sizes; for the writing, larger array sizes require first-arrival circuitry with more inputs. The read cost is approximately 2 pJ per line, while the write cost is around 10 pJ per line. This 5× factor between read and write energies drives tradeoff considerations in designs.

The most computationally intensive pure race logic function is the tropical VMM, which implements a single-step all-to-all graph traversal. Such an operation naturally scales as $N^2$. On average, this system ends up costing ~700 fJ per cell, so a 32×32 grid consumes ~700 pJ of energy. The large energy cost of this operation arises from the conservative design strategy that was employed. To make sure that the OR pulldown network functions properly, it is important to ensure that the time constants of the pulldown dynamics are not determined by the CMOS—that is, it is important to ensure that it switches quicker than the resolution of the temporal code. The low read voltage causes the pulldown transistor to discharge too slowly, causing multiple nodes pulling down the same source line and leading to functional incorrectness of tropical addition. To overcome this issue, the test designs add level shifters to each cell to boost the input voltage from $V_{read}$ to $V_{dd}$. These provide the necessary overdrive for correct operation.

Other pure race logic functions such as ⊕=min, ⊕'=max, and ⊸=inhibit, compound functions such as argmin and binarize, and control and multiplexing circuits can be implemented with conventional CMOS gates and have a minimal energy cost for this process node. For example, for 32-channel elementwise min, max, and inhibit operations, the energy cost is approximately 1 pJ. This is negligible compared to temporal read, write, and VMM operations. The argmin operation has the largest energy cost among the combinatorial gates, since the first arriving input has to turn off all of the other channels and must therefore drive circuits with a larger output capacitance.

Graph processing is a well-studied problem in computing, and a variety of solutions have been proposed for it at various scales. Processing of real world graphs—which can contain hundreds of thousands of nodes and millions of edges—combines both software and hardware frameworks, employing everything from "central processing units" (CPUs), "field programmable gate arrays" (FPGAs), and "graphics processing units" (GPUs) to "application specific integrated circuits" (ASICs) and "processing-in-memory" (PIM) solutions. Graph operations are known to have a high communication-to-computation ratio, as the cost of memory movement sometimes accounts for upwards of 90% of total energy expenditures.

In one test, the following approach was taken: GPU and ASIC approaches with domain-specific kernel implementations amortize the costs of memory accesses effectively and are popular. For example, MapGraph and Gunrock (points (a, b) in graph 1105 of FIG. 11(b)) are examples of GPU-based graph analytics packages commonly used as a baseline when reporting performance. More recently, domain-specific accelerators have emerged that have custom datapaths, scheduling strategies, scratchpad memory, and other techniques specifically designed to alleviate the irregularities associated with graph analytics. The literature on these approaches effectively reports the memory versus processing costs, allowing a comparison between just the performance of our kernel with the performance of other state-of-the-art graph kernels (points (c, d) in graph 1105 of FIG. 11(b)). Under this analysis, a temporal state machine circuit could be substituted for existing subgraph kernels. More recently, temporal ASICs have also been proposed that solve specific graph problems with restricted topologies. Though not designed for arbitrary graph topologies, they result in superior performance to conventional ASICs. Specific works we compare against are References (points (e, f, g) in FIG. 7(b)).

Figure 11A:
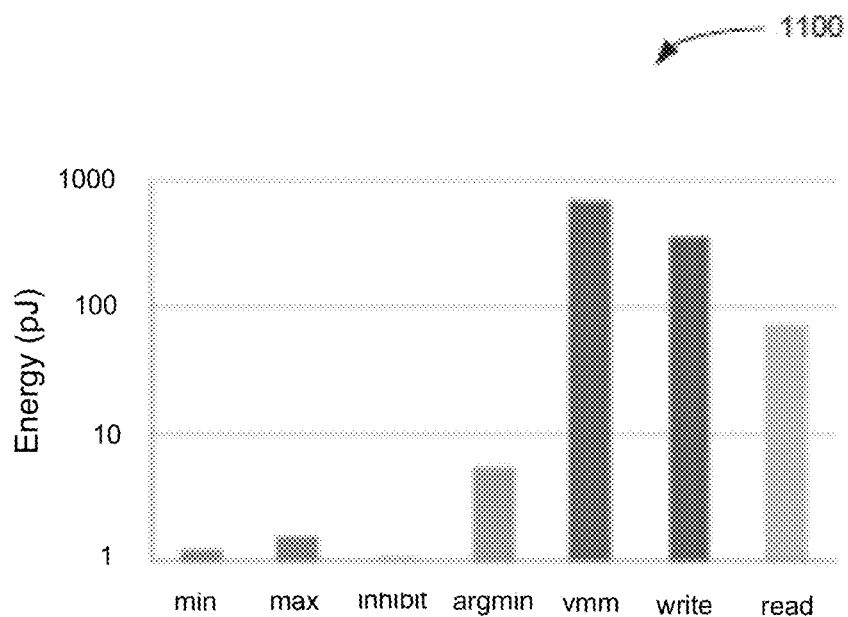
FIGS. 11(a) and 11(b) are a pair of graphs showing energy cost and efficiency for implementation of various basic operations.
Figure 11B:
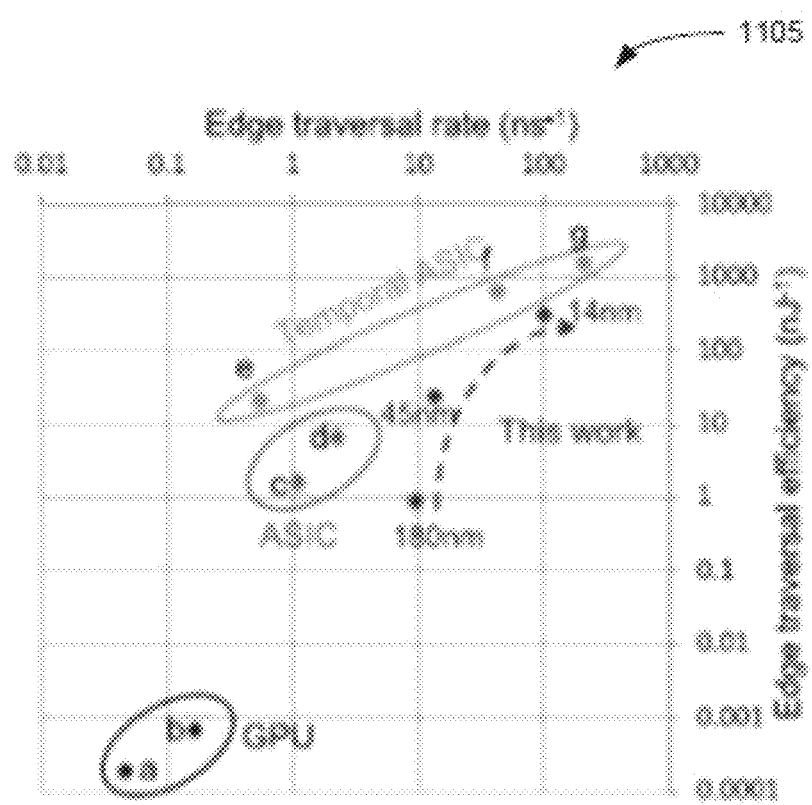

The metric widely used to make speed or latency comparisons is the edge traversal rate, commonly reported as "giga-edge traversals per second" (GETS) in the literature. For energy efficiency, reference is made to edges traversed per unit energy—"giga-edge traversals per joule" (GETJ) in the literature. FIG. 11(a) illustrates a graph 1100 showing the performance comparison of this work against GPU and ASIC approaches. A single 32×32 kernel in a 180 nm technology node has an edge traversal rate of 10 ns$^{-1}$ (10 GETS) and the energy efficiency is about 1 nJ$^{-1}$ (1 GETJ), which compares favorably with the state-of-the-art. Using scaling projections, it is estimated that a single kernel can theoretically surpass state-of-the-art kernel performance. When scaled up to larger N×N array sizes, such as N=128 or N=256 (not an uncommon core size for memristor crossbars), massive performance improvements are expected. Note that the state-of-the-art for graph processing engines when energy is of no concern is on the order of 100 s of GETS, which this analysis indicates to be feasible for temporal designs.

Independent but parallel work on graph problems is being undertaken by the neuromorphic computing community. Dijkstra's algorithm has been studied by researchers in neuromorphic computing as a benchmark application for the field. State-of-the-art industrial research spiking neural network platforms use Dijkstra's algorithm to establish performance metrics for their systems. Implementing an operation equivalent to the tropical VMM costs approximately 2.5 nJ in a 65 nm process. By comparison, combining both the memory and VMM primitives, race logic performs the same operation for 1 nJ in a 180 nm process.

Graph processing of largescale graphs containing trillions of nodes and edges, such as the Internet and social networks, has always been hard to accelerate regardless of hardware choice. Conventional approaches to analyzing these networks rely on graph partitioning, wherein a large graph is partitioned into K subgraphs with a minimal number of edges cut. The K subgraphs can be fit into local processors, with minimal communication between processors. The partitioning problem itself is NP-hard and relies on heuristics for speedup. Various techniques exist for solving such problems: multi-level graph partitioning (involving coarsening, initial partitioning, and fine-tuning), edge or vertex based partitioning, breadth-first-search-based partitioning, and others. The various embodiments and circuits described herein may find usefulness in implementation of efficient kernels for accelerating post-partitioned local graph processing.

Chaining of temporal operations: Temporal computation leads to unconventional architectures that come with their own design constraints. The cost of primitive operations (aside from the VMM) in temporal computing is cheap compared to memory access operations. This points to utilizing strategies that amortize the cost of memory accesses over multiple feed-forward operations. Thus, various systems employing the concepts and advantages herein would greatly benefit by performing many such operations in a single phase. In Algorithm 3, for instance, neither e nor d need to be stored in memory. A sophisticated compiler could detect optimally long compositions of pure race logic functions and only use memory where invariance or causality need to be broken. Though such a state machine would benefit from additional control logic with separate clock and dummy lines, the energy savings accrued by this sort of optimization would be significant.

Simple versus complex computational units: As higher-level algorithms become more clearly expressible, some additional considerations are taken into account A design with simpler fundamental primitives could be more flexible, but might sacrifice performance. An example of that can be seen in the parent matrix update of Algorithm 3. A 2D update array similar to the VMM could amortize the cost of N extra operations, and hence save on N memory reads and writes, in just a single operation. Hence, a more complex operation would have smaller energy and delay, which would be very favorable—at the cost of specialized circuitry.

In this disclosure, it should be recognized that the building blocks for generalizability of temporal computing are now available using the techniques of this disclosure. Provided is a problem-agnostic datapath and a mathematical algebra, expanding the logical framework of race logic. This leads to novel circuit designs that are informed by higher-level algorithmic requirements. The properties of abstraction and composability offered by the mathematical framework coupled with native storage from the temporal memory lend themselves to generalization. Designed is a state machine that can carry out both specialized and general graph algorithms such as the Needleman-Wunsch and Dijkstra's algorithm. Likewise, graph accelerators built on temporal computing are further uses of temporal state machines Various designs, implementations, and associated examples and evaluations of temporal domain memory components, computational/operational components, and state machines (and more high-complexity computational circuits) have been disclosed. The framework for computational circuit design presented herein addresses the limitations of existing work and pushes the state-of-the-art forward through its innovative, and flexible design that allows for all or partial aspects of computation to be performed in the time domain. However, it is to be understood the present disclosure has been presented in terms of one or more preferred embodiments, and it should be appreciated that many equivalents, alternatives, variations, and modifications, aside from those expressly stated, are possible and within the scope hereof.

What is claimed is:

1. A temporal state machine comprising:
   a temporal computational unit comprising at least one circuit to perform a time-domain operation;
   a temporal memory unit; and
   circuitry to electrically couple memory output lines and memory input lines of the temporal memory to the computational unit;
   wherein the computational unit and temporal memory unit are electrically coupled such that the computation unit can access time-encoded memory recall wavefronts from the temporal memory to perform the time-domain operation, and output time-encoded output wavefronts.

2. The temporal state machine of claim 1, wherein the time-domain operation comprises a general computational function.

3. The temporal state machine of claim 2, wherein the general computational function is at least one of a min function and a max function.

4. The temporal state machine of claim 2, wherein the time-domain operation comprises an algebraic operation.

5. The temporal state machine of claim 1, wherein a computational output line of the temporal computational unit is electrically connected to a memory input line of the temporal memory, so that the temporal computational unit can write output data to the temporal memory.

6. The temporal state machine of claim 5, wherein a computational input line of the temporal computational unit is electrically connected to a memory output line of the temporal memory, so that the temporal computational unit can perform the time-domain operation on temporally-encoded data accessed from the temporal memory.

7. The temporal state machine of claim 6, wherein the temporal computational unit is configured to output temporally-encoded wavefront signals to the memory input line of the memory unit and access temporally-encoded wavefront signals from the memory output line of the memory unit.

8. The temporal state machine of claim 1, wherein the temporal computational unit comprises circuit components configured to operate on time-delayed wavefronts, the circuit components arranged in a configuration to cause the computational unit to perform at least one tropical algebraic function.

9. The temporal state machine of claim 8, wherein the at least one tropical algebraic function performs vector matrix multiplication (VMM).

\* \* \* \* \*